(12) United States Patent
Otake

(10) Patent No.: US 11,817,376 B2
(45) Date of Patent: Nov. 14, 2023

(54) SEMICONDUCTOR DEVICE

(71) Applicant: Rohm Co., Ltd., Kyoto (JP)

(72) Inventor: Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/882,274

(22) Filed: Aug. 5, 2022

(65) Prior Publication Data

US 2022/0375835 A1    Nov. 24, 2022

Related U.S. Application Data

(63) Continuation of application No. 16/868,886, filed on May 7, 2020, now Pat. No. 11,444,009.

(30) Foreign Application Priority Data

May 16, 2019    (JP) .................. 2019-092622

(51) Int. Cl.
  *H01L 23/495*    (2006.01)
  *H01L 23/31*    (2006.01)
  *H01L 29/778*    (2006.01)

(52) U.S. Cl.
  CPC .... *H01L 23/49562* (2013.01); *H01L 23/3107* (2013.01); *H01L 29/778* (2013.01)

(58) Field of Classification Search
  CPC ........... H01L 23/49562; H01L 23/3107; H01L 29/778
  See application file for complete search history.

(56) References Cited

U.S. PATENT DOCUMENTS

| | | | |
|---|---|---|---|
| 9,917,578 B2 | 3/2018 | Prechtl et al. | |
| 2013/0187627 A1* | 7/2013 | Imada | H01L 23/49575 323/311 |
| 2015/0311142 A1* | 10/2015 | Sekar | H01L 23/481 257/499 |

FOREIGN PATENT DOCUMENTS

| | | |
|---|---|---|
| JP | 2011-165749 A | 8/2011 |
| WO | 2015/099030 A1 | 7/2015 |
| WO | 2018/186353 A1 | 10/2018 |
| WO | 2019/053905 A1 | 3/2019 |

OTHER PUBLICATIONS

Office Action received in the corresponding Japanese Patent application, dated May 30, 2023, and machine translation (8 pages).

* cited by examiner

*Primary Examiner* — Robert G Bachner
(74) *Attorney, Agent, or Firm* — Hamre, Schumann, Mueller & Larson, P.C.

(57) ABSTRACT

A semiconductor device includes: a first transistor provided with an electron transit layer made of a nitride semiconductor, a first gate electrode, a first source electrode, and a first drain electrode; and a second transistor that includes a second gate electrode, a second source electrode, and a second drain electrode. The first gate electrode and the second drain electrode are electrically connected to each other, while the first source electrode and the second source electrode are not electrically connected to each other.

17 Claims, 14 Drawing Sheets

SEMICONDUCTOR DEVICE

FIELD

The present disclosure relates to a semiconductor device.

BACKGROUND ART

Among various semiconductor elements available in the market, there are HEMTs (High Electron Mobility Transistors) that have been being developed. To constitute a HEMT, use is made of a group III-V nitride semiconductor ("nitride semiconductor") such as gallium nitride (GaN).

Generally, HEMTs have a low gate threshold value (e.g., 2 V or less), and this value may further decrease at high temperatures. Such HEMTs may be used to constitute a bridge circuit, with one HEMT disposed on the low potential side and another on the high potential side. Due to the above-noted low-threshold properties, however, when the high-side HEMT is switched ON while the low-side HEMT is in the OFF state, the low-side HEMT may be unduly turned ON (so-called "false turn-on"), thereby causing a short circuit. More specifically, when the high-side HEMT is switched ON, voltage between the drain and the source of the low-side HEMT increases suddenly, which may cause a surge voltage to occur due to parasitic inductance of the current path between the gate and the source of the low-side HEMT. Thus, the voltage between the gate and the source also increases instantaneously. Since the gate threshold value of HEMTs is low, the soaring gate-source voltage may readily exceed the threshold, whereby the low-side HEMT is also switched ON and a short circuit occurs. As a result, a large current will flow through the and damage HEMTs. This is particularly problematic when use is made of HEMTs having a significantly small parasitic capacitance and significantly high change rate of the voltage between the drain and the source.

As a solution to the above problem, a semiconductor device may be configured such that the fluctuation of voltage between the gate and the source of an HEMT is suppressed by an FET (Field Effect Transistor) provided for clamping between the gate and the source of the HEMT, so that and passing electricity through the FET while the HEMT is switched OFF (see U.S. Pat. No. 9,917,578).

However, the semiconductor device disclosed in the above US document is only configured to regulate the HEMT's gate-source voltage to 0 V. Hence, when the HEMT's gate threshold is not high enough, the same problem will occur.

SUMMARY

In light of the foregoing, an object of the present disclosure is to provide a semiconductor device capable of suppressing or even eliminating false turn-on.

A semiconductor device provided according to an aspect of the present disclosure provided with: a first transistor that includes an electron transit layer made of a nitride semiconductor, a first gate electrode, a first source electrode, and a first drain electrode; and a second transistor that includes a second gate electrode, a second source electrode, and a second drain electrode. The first gate electrode and the second drain electrode are electrically connected to each other, while the first source electrode and the second source electrode are not electrically connected to each other.

With the above configurations, the gate-source voltage fluctuation in the first transistor can be suppressed by turning the second transistor on while the first transistor is off. Furthermore, since the first source electrode and the second source electrode are not electrically connected to each other, the two source electrodes can be put at mutually different potentials. Hence, for the voltage between the gate and the source of the first transistor, a negative reference value can be set by rendering the potential of the second source electrode lower than that of the first source electrode. Thus, even if the gate-source voltage of the first transistor fluctuates to a certain degree, the voltage (in particular, the maximum value of voltage) can be kept from exceeding the gate threshold value.

Other features and advantages of the present disclosure will become clearer by the detailed description given below with reference to the accompanying drawings.

EMBODIMENTS

Embodiments of the present disclosure will be described below with reference to the accompanying drawings.

A semiconductor device A1 according to a first embodiment of the present disclosure will be described with reference to FIGS. 1 to 7. The semiconductor device A1 includes a plurality of leads 1 to 6, a semiconductor element 7, bonding wires 9, and a sealing resin 8.

Figure 1:
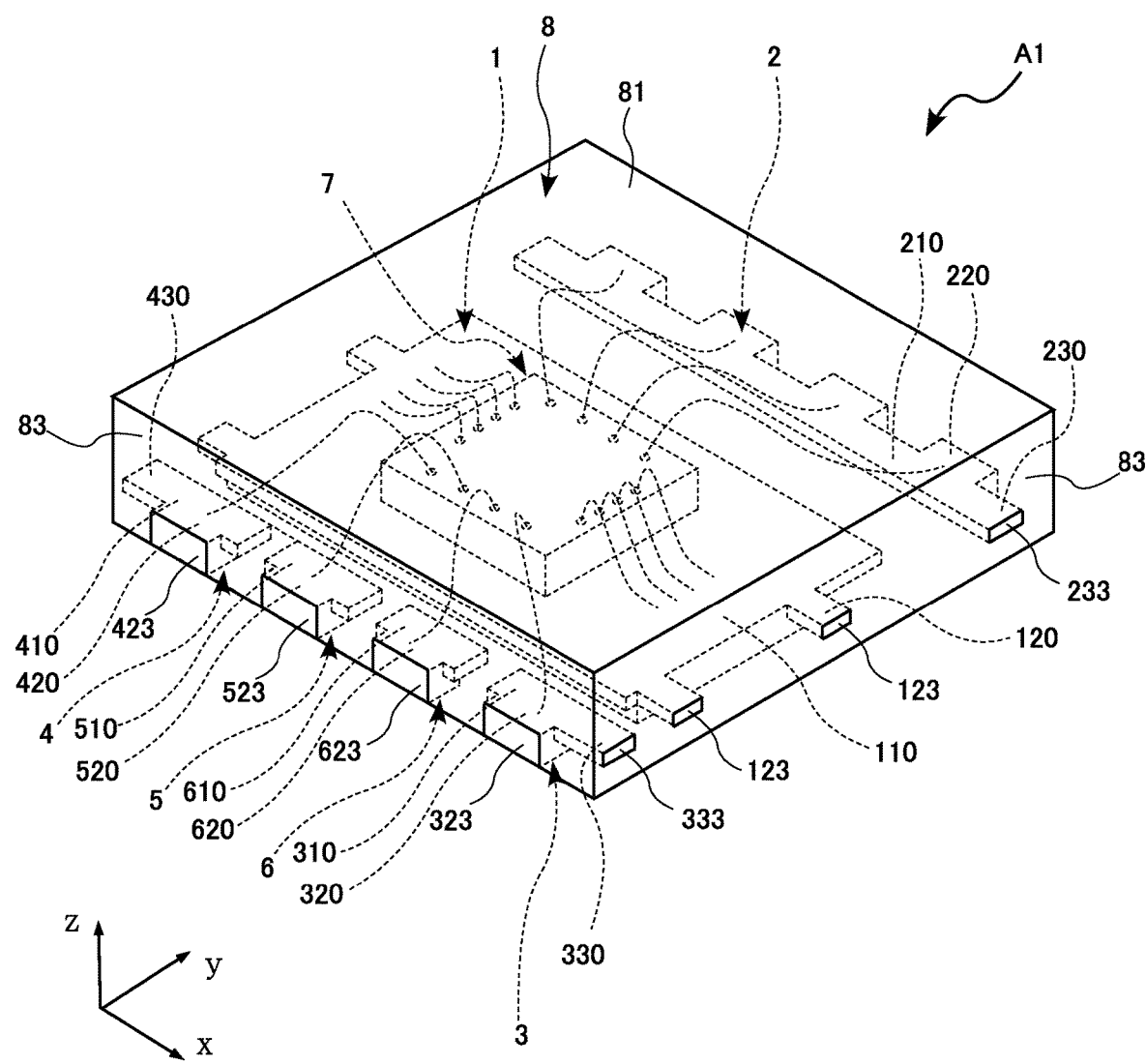
FIG. 1 is a perspective view showing a semiconductor device according to a first embodiment of the present disclosure.

The illustrated semiconductor device A1 can be surface-mounted on e.g. a circuit board. The semiconductor device A1 has a rectangular shape in plan view or in a thickness direction. In this disclosure, the thickness direction of e.g.

the semiconductor device A1 will be referred to as the "z direction", which is perpendicular to two other mutually perpendicular directions, i.e., the x direction and the y direction (see FIG. 1, for example). The sizes of the semiconductor device A1 are not limited to particular ones. In the illustrated example, the semiconductor device A1 may have a size (length or width) of about 1 to 10 mm along the x direction, a length (width or length) of about 1 to 10 mm along the y direction, and a length (thickness) of about 0.3 to 3 mm along the z direction.

The leads 1 to 6 support and/or are electrically connected to the semiconductor element 7. The leads 1 to 6 are made of metal, preferably Cu, Ni, an alloy of Cu or Ni, or a 42 alloy, for example. The present embodiment describes a case in which the leads 1 to 6 are made of Cu. The thickness of the leads 1 to 6 is 0.08 to 1 mm, for example, and is about 0.5 mm in the illustrated example. The leads 1 to 6 are formed by etching a metal plate, for example. Note that the leads 1 to 6 may also be formed by punching or bending a metal plate. In the following description, the leads 1 to 6 may be individually referred to as a "first lead 1", "second lead 2", "third lead 3", "fourth lead 4", "fifth lead 5", and "sixth lead 6".

Figure 2:
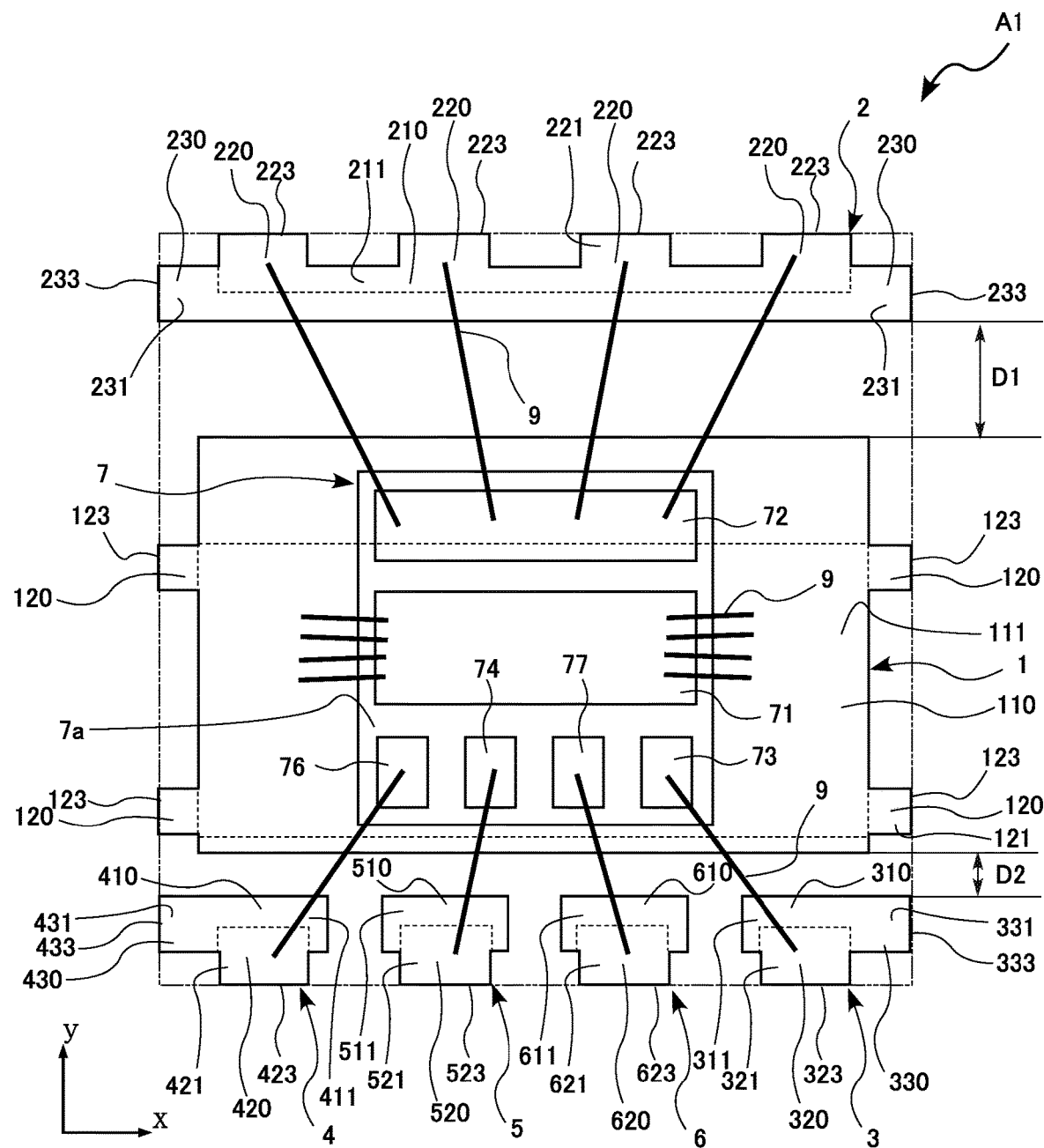
FIG. 2 is a plan view of the semiconductor device shown in FIG. 1.

As shown in FIG. 2, the first lead 1 has a generally rectangular shape and is disposed closer to the lower end than to the opposite end in the y direction. In the x direction, the first lead 1 (including linkage portions 120) extends continuously in the x direction from one edge (e.g., left edge) to the other edge (e.g., right edge) of the device A1.

The second lead 2 and the third lead 3 are disposed opposite to each other in the y direction with the first lead 1 disposed therebetween, and each lead 2, 3 is spaced apart, upward or downward, from the first lead 1 in the y direction. In the illustrated example, the second lead 2 is disposed at the upper end (in FIG. 2) and extends elongate throughout in the x direction, e.g., from the left edge to the right edge without a break. The third lead 3 is disposed at the lower end in the y direction while also being offset to the right edge in the x direction, so that the lead 3 is adjacent to the right edge of the device A1.

In FIG. 2, the fourth lead 4, the fifth lead 5, and the sixth lead 6 are disposed on the same side with respect to the first lead 1 (i.e., below the lead 1 in the figure), so is the third lead 3. Hence, the fourth through sixth leads 4-6 and the third lead 3 are likely spaced apart from the lead 1 while also being disposed side by side (from left to right) in the x direction. In plan view, the second lead 2 is disposed opposite to the respective leads 3 to 6 with the first lead 1 interposed between the second lead 2 and the other four leads. In plan view, the first lead 1 is greater in area than each of the other leads 2 to 6, among which the second lead 2 has the greatest area, and the remaining four leads 3-6 are substantially equal to each other in area. As shown in FIG. 2, the distance D1 between the first lead 1 and the second lead 2 is greater than the distance D2 between the first lead 1 and each of the leads 3 to 6.

The first lead 1 includes a mounting portion 110 and linkage portions 120. The mounting portion 110 (or main portion occupying most of the area of the lead 1) has a rectangular shape as viewed in the z direction. The mounting portion 110 includes a mounting portion obverse surface 111 and a mounting portion reverse surface 112. On the side of the reverse surface 112, the mounting portion 110 is formed with a recess 113 ("mounting portion reverse surface recess"). In the illustrated example (see FIG. 4), the recess 113 comprises two elongated recessed regions spaced apart from each other in the y direction the reverse surface 112 intervening therebetween. The mounting portion obverse surface 111 and the mounting portion reverse surface 112 face mutually opposite sides in the z direction. The semiconductor element 7 is mounted on the mounting portion obverse surface 111. The mounting portion reverse surface 112 is exposed from the sealing resin 8 to serve as a reverse surface terminal. The mounting portion obverse surface 111 may correspond to a "first obverse surface" in the present disclosure and the mounting portion reverse surface 112 may correspond to a "first reverse surface" in the present disclosure. The mounting portion reverse surface recess 113 is recessed from the mounting portion reverse surface 112 in the z direction. In the mounting portion 110, the thickness (size in the z direction) of the portion in which the recess 113 is provided is about half the thickness of the remaining portion, in which the mounting portion reverse surface 112 is provided. The mounting portion reverse surface recess 113 is formed through half-etching, for example.

The linkage portions 120 are continuous to the mounting portion 110 and each have a rectangular shape as viewed in the z direction. Two linkage portions 120 are disposed on each of the two end surfaces of the mounting portion 110 that are spaced apart from each other in the x direction. Each linkage portion 120 includes a linkage portion obverse surface 121, a linkage portion reverse surface 122, and a linkage portion end surface 123. The linkage portion obverse surface 121 and the linkage portion reverse surface 122 face mutually opposite sides in the z direction. The linkage portion obverse surface 121 faces upward in FIGS. 3 and 5. The linkage portion obverse surface 121 is flush with the mounting portion obverse surface 111. The linkage portion reverse surface 122 faces downward in FIGS. 3 and 5. The thickness (length in the z direction) of the linkage portions 120 is substantially the same as the portion of the mounting portion 110 in which the mounting portion reverse surface recess 113 is located. The linkage portions 120 are formed by half-etching, for example. The linkage portion end surface 123 connects the linkage portion obverse surface 121 to the linkage portion reverse surface 122 and faces outward in the x direction. The linkage portion end surface 123 is exposed from the sealing resin 8 (see FIGS. 1 and 5.)

The second lead 2 is disposed at an end portion (upper side in FIG. 2) of the semiconductor device A1 in the y direction and extends throughout the x direction as viewed in the z direction, and includes a wire bonding portion 210, terminal portions 220, and linkage portions 230.

The wire bonding portion 210 has a rectangular shape that is elongated in the x direction as viewed in the z direction. The wire bonding portion 210 includes a wire bonding portion obverse surface 211, a wire bonding portion reverse surface 212, and a wire bonding portion reverse surface recess 213. The wire bonding portion obverse surface 211 and the wire bonding portion reverse surface 212 face mutually opposite sides in the z direction. The wire bonding portion obverse surface 211 faces upward in FIGS. 3 and 5. Bonding wires 9 are bonded to the wire bonding portion obverse surface 211. The wire bonding portion reverse surface 212 faces downward in FIGS. 3 and 5. The wire bonding portion reverse surface 212 is exposed from the sealing resin 8 and serves as a reverse surface terminal. The wire bonding portion reverse surface recess 213 is a portion of the wire bonding portion 210 that is recessed from the wire bonding portion reverse surface 212 in the z direction. The thickness (length in the z direction) of the portion of the wire bonding portion 210 in which the wire bonding portion reverse surface recess 213 is located is about half the thickness of a portion of the wire bonding portion 210 in which the wire bonding portion reverse surface 212 is located. The wire bonding portion reverse surface recess 213 is formed through half-etching, for example.

The terminal portions 220 are continuous to the wire bonding portion 210 and each have a rectangular shape as viewed in the z direction. Four terminal portions 220 are disposed in the x direction at one end surface (end surface that faces the outside of the semiconductor device A1) of the wire bonding portion 210 in the y direction. Each terminal portion 220 includes a terminal portion obverse surface 221, a terminal portion reverse surface 222, and a terminal portion end surface 223. The terminal portion obverse surface 221 and the terminal portion reverse surface 222 face mutually opposite sides in the z direction. The terminal portion obverse surface 221 faces upward in FIGS. 3 and 5. The terminal portion obverse surface 221 is flush with the wire bonding portion obverse surface 211. The terminal portion reverse surface 222 faces downward in FIGS. 3 and 5. The terminal portion reverse surface 222 is flush with the wire bonding portion reverse surface 212. The terminal portion end surfaces 223 connect the terminal portion obverse surface 221 and the terminal portion reverse surface 222 to each other and face outward in the y direction. The wire bonding portion reverse surface 212, the terminal portion reverse surface 222, and the terminal portion end surfaces 223 are exposed from the sealing resin 8, are continuous to each other, and serve as a terminal.

Two linkage portions 230 are provided and are respectively continuous to opposite end portions of the wire bonding portion 210 in the x direction. The thickness (length in the z direction) of the linkage portions 230 is substantially the same as the thickness of the portion of the wire bonding portion 210 in which the wire bonding portion reverse surface recess 213 is located. The linkage portions 230 are formed by half-etching, for example. Each linkage portion 230 includes a linkage portion obverse surface 231, a linkage portion reverse surface 232, and a linkage portion end surface 233. The linkage portion obverse surface 231 and the linkage portion reverse surface 232 face mutually opposite sides in the z direction. The linkage portion obverse surface 231 faces upward in FIGS. 3 and 5. The linkage portion obverse surface 231 is flush with the wire bonding portion obverse surface 211. Accordingly, the wire bonding portion obverse surface 211, the terminal portion obverse surface 221, and the linkage portion obverse surface 231 are flush with each other forming a single surface (see FIG. 2). The linkage portion reverse surface 232 faces downward in FIGS. 3 and 5. Out of surfaces that connect the linkage portion obverse surface 231 to the linkage portion reverse surface 232, the linkage portion end surface 233 is a surface that faces the x direction and is exposed from the sealing resin 8.

The third lead 3 is disposed at a corner portion (lower right corner portion in FIG. 2) of the semiconductor device A1 as viewed in the z direction and includes a wire bonding portion 310, a terminal portion 320, and a linkage portion 330.

The wire bonding portion 310 has a rectangular shape that is elongated in the x direction as viewed in the z direction. The wire bonding portion 310 includes a wire bonding portion obverse surface 311, a wire bonding portion reverse surface 312, and a wire bonding portion reverse surface recess 313. The wire bonding portion obverse surface 311 and the wire bonding portion reverse surface 312 face mutually opposite sides in the z direction. The wire bonding portion obverse surface 311 faces upward in FIGS. 3 and 5. A bonding wire 9 is bonded to the wire bonding portion obverse surface 311. The wire bonding portion reverse surface 312 faces downward in FIGS. 3 and 5. The wire bonding portion reverse surface 312 is exposed from the sealing resin 8 and serves as a reverse surface terminal. The wire bonding portion reverse surface recess 313 is a portion of the wire bonding portion 310 that is recessed from the wire bonding portion reverse surface 312 in the z direction. The thickness (length in the z direction) of the portion of the wire bonding portion 310 in which the wire bonding portion reverse surface recess 313 is located is about half the thickness of a portion of the wire bonding portion 310 in which the wire bonding portion reverse surface 312 is located. The wire bonding portion reverse surface recess 313 is formed through half-etching, for example.

The terminal portion 320 is continuous to the wire bonding portion 310 and has a rectangular shape as viewed in the z direction. The terminal portion 320 is disposed at one end surface (end surface that faces the outside of the semiconductor device A1) of the wire bonding portion 310 in the y direction. The terminal portion 320 includes a terminal portion obverse surface 321, a terminal portion reverse surface 322, and a terminal portion end surface 323. The terminal portion obverse surface 321 and the terminal portion reverse surface 322 face mutually opposite sides in the z direction. The terminal portion obverse surface 321 faces upward in FIGS. 3 and 5. The terminal portion obverse surface 321 is flush with the wire bonding portion obverse surface 311. The terminal portion reverse surface 322 faces downward in FIGS. 3 and 5. The terminal portion reverse surface 322 is flush with the wire bonding portion reverse surface 312. The terminal portion end surface 323 connects the terminal portion obverse surface 321 to the terminal portion reverse surface 322 and faces outward in the y direction. The wire bonding portion reverse surface 312, the terminal portion reverse surface 322, and the terminal portion end surface 323 are exposed from the sealing resin 8, are continuous to each other, and serve as a terminal.

The linkage portion 330 is disposed on the outer side (right side in FIG. 2) of the wire bonding portion 310 in the x direction and is continuous to the wire bonding portion 310. The thickness (length in the z direction) of the linkage portion 330 is substantially the same as the thickness of the portion of the wire bonding portion 310 in which the wire bonding portion reverse surface recess 313 is located. The linkage portion 330 is formed through half-etching, for example. The linkage portion 330 includes a linkage portion obverse surface 331, a linkage portion reverse surface 332, and a linkage portion end surface 333. The linkage portion obverse surface 331 and the linkage portion reverse surface 332 face mutually opposite sides in the z direction. The linkage portion obverse surface 331 faces upward in FIGS. 3 and 5. The linkage portion obverse surface 331 is flush with the wire bonding portion obverse surface 311. Accordingly, the wire bonding portion obverse surface 311, the terminal portion obverse surface 321, and the linkage portion obverse surface 331 are flush with each other forming a single surface (see FIG. 2). The linkage portion reverse surface 332 faces downward in FIGS. 3 and 5. Out of surfaces that connect the linkage portion obverse surface 331 to the linkage portion reverse surface 332, the linkage portion end surface 333 is a surface that faces the x direction and is exposed from the sealing resin 8.

The fourth lead 4 is disposed at a corner portion (lower left corner portion in FIG. 2) of the semiconductor device A1 as viewed in the z direction, and includes a wire bonding portion 410, a terminal portion 420, and a linkage portion 430.

The wire bonding portion 410 has a rectangular shape that is elongated in the x direction as viewed in the z direction. The wire bonding portion 410 includes a wire bonding portion obverse surface 411, a wire bonding portion reverse surface 412, and a wire bonding portion reverse surface recess 413. The wire bonding portion obverse surface 411 and the wire bonding portion reverse surface 412 face mutually opposite sides in the z direction. The wire bonding portion obverse surface 411 faces upward in FIGS. 3 and 5. A bonding wire 9 is bonded to the wire bonding portion obverse surface 411.

Figure 3:
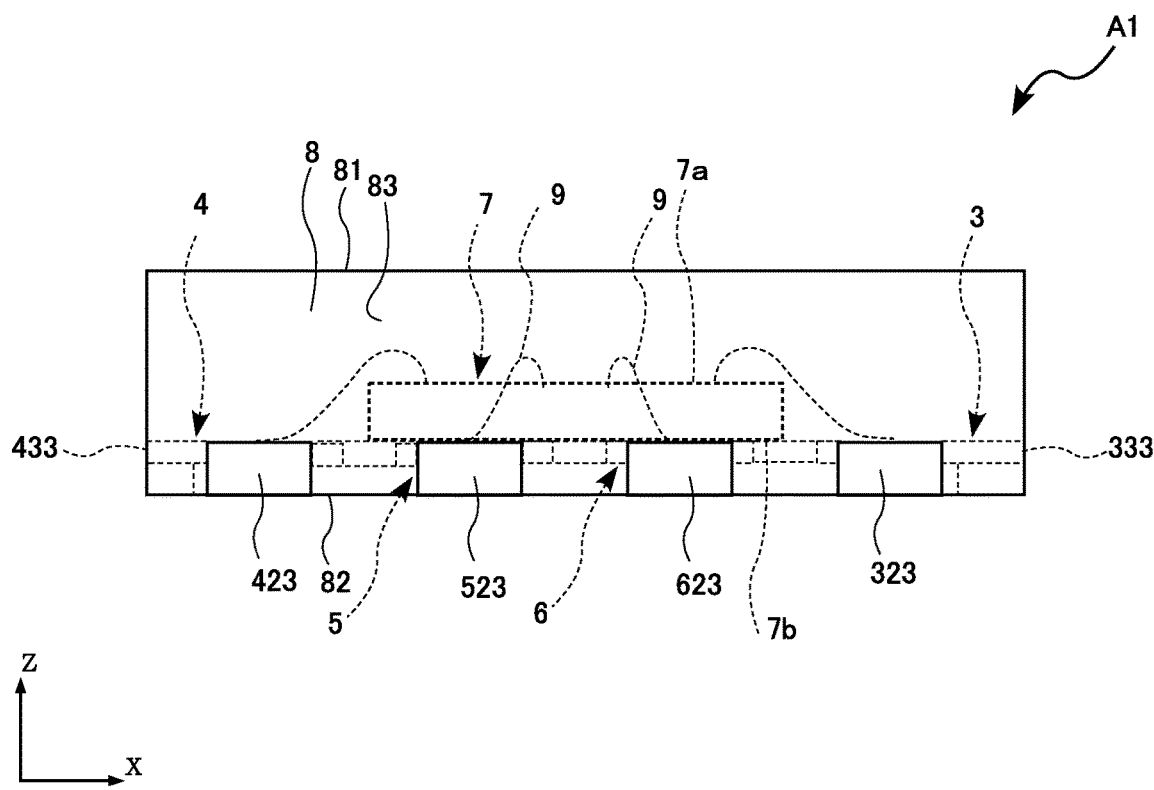
FIG. 3 is a front view of the semiconductor device shown in FIG. 1.
Figure 4:
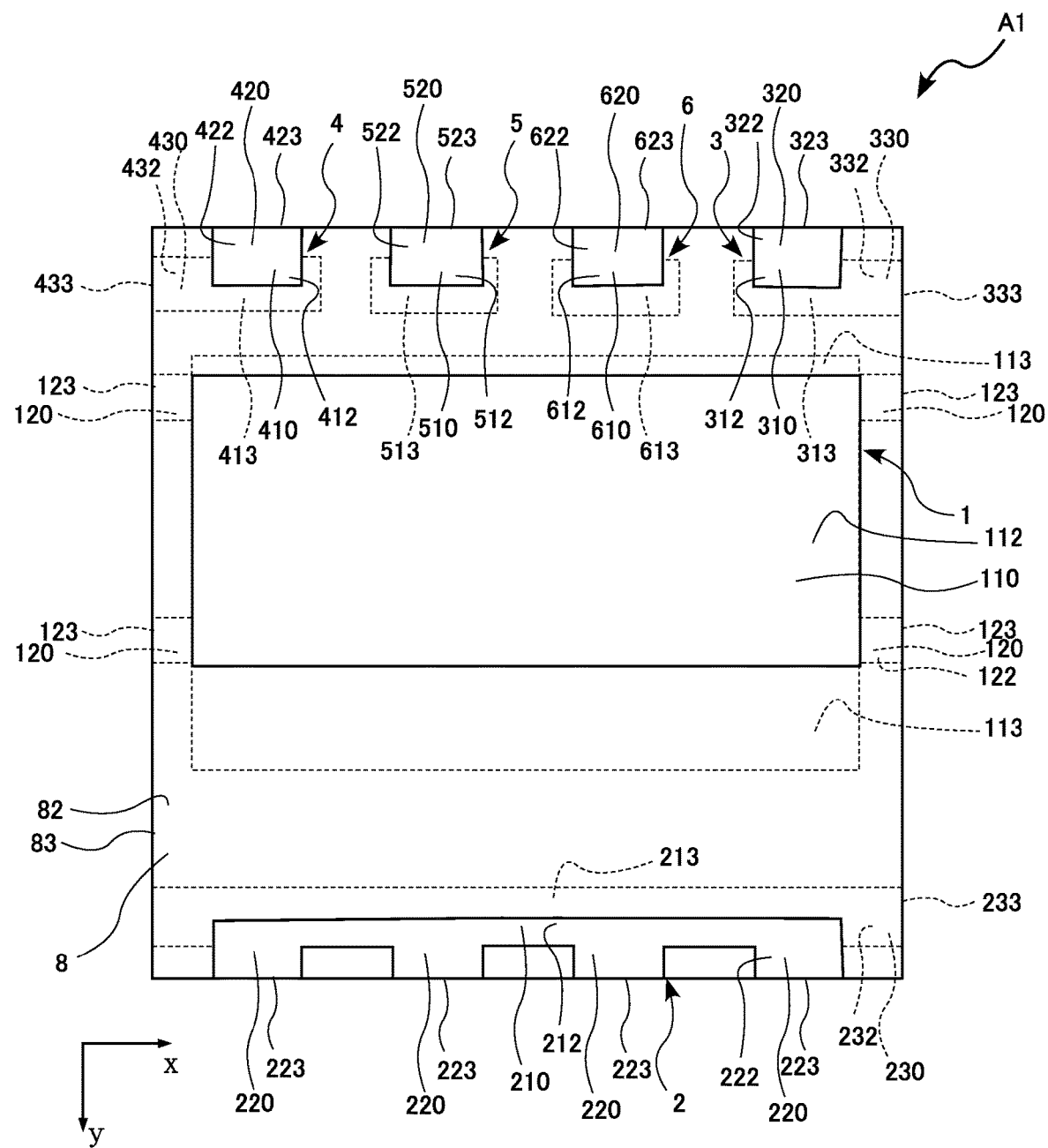
FIG. 4 is a bottom view of the semiconductor device shown in FIG. 1.
Figure 5:
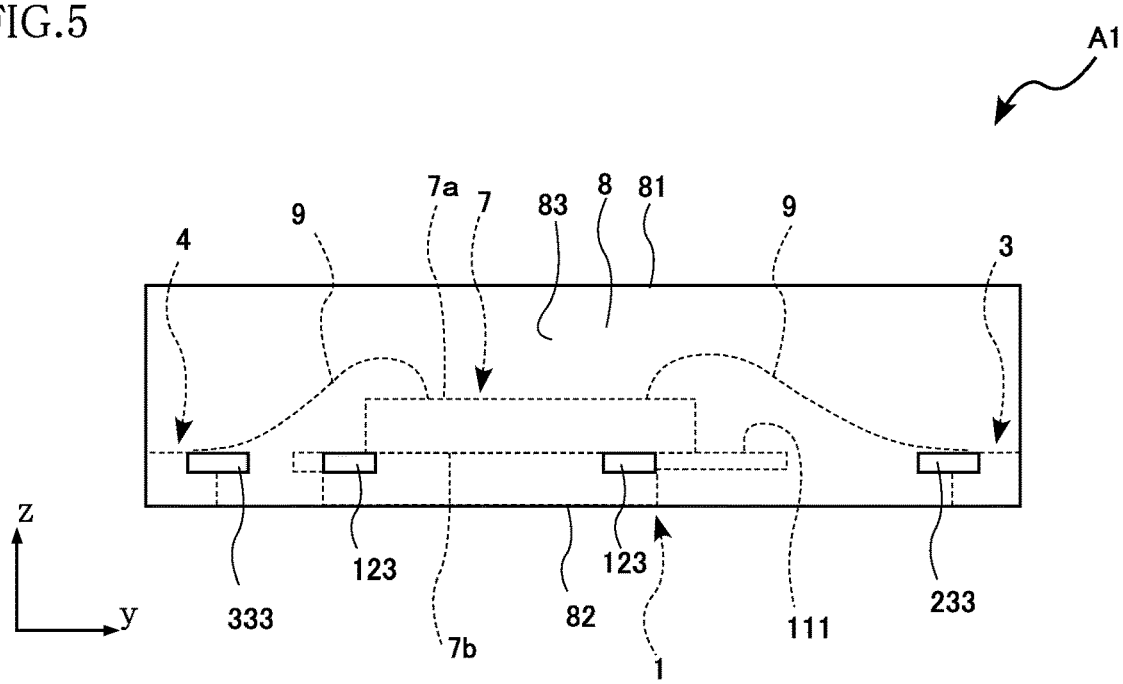
FIG. 5 is a right-side view of the semiconductor device shown in FIG. 1.

The wire bonding portion reverse surface 412 faces downward in FIGS. 3 and 5. The wire bonding portion reverse surface 412 is exposed from the sealing resin 8 and serves as a reverse surface terminal. The wire bonding portion reverse surface recess 413 is a portion of the wire bonding portion 410 that is recessed from the wire bonding portion reverse surface 412 in the z direction. The thickness (length in the z direction) of the portion of the wire bonding portion 410 in which the wire bonding portion reverse surface recess 413 is located is about half the thickness of a portion of the wire bonding portion 410 in which the wire bonding portion reverse surface 412 is located. The wire bonding portion reverse surface recess 413 is formed through half-etching, for example.

The terminal portion 420 is continuous to the wire bonding portion 410 and has a rectangular shape as viewed in the z direction. The terminal portion 420 is disposed at one end surface (end surface that faces outward of the semiconductor device A1) of the wire bonding portion 410 in the y direction. The terminal portion 420 includes a terminal portion obverse surface 421, a terminal portion reverse surface 422, and a terminal portion end surface 423. The terminal portion obverse surface 421 and the terminal portion reverse surface 422 face mutually opposite sides in the z direction. The terminal portion obverse surface 421 faces upward in FIGS. 3 and 5. The terminal portion obverse surface 421 is flush with the wire bonding portion obverse surface 411. The terminal portion reverse surface 422 faces downward in FIGS. 3 and 5. The terminal portion reverse surface 422 is flush with the wire bonding portion reverse surface 412. The terminal portion end surface 423 connects the terminal portion obverse surface 421 to the terminal portion reverse surface 422 and faces outward in the y direction. The wire bonding portion reverse surface 412, the terminal portion reverse surface 422, and the terminal portion end surface 423 are exposed from the sealing resin 8, are continuous to each other, and serve as a terminal.

The linkage portion 430 is disposed on the outer side (left side in FIG. 2) of the wire bonding portion 410 in the x direction and is continuous to the wire bonding portion 410. The thickness (length in the z direction) of the linkage portion 430 is substantially the same as the thickness of the portion of the wire bonding portion 410 in which the wire bonding portion reverse surface recess 413 is located. The linkage portion 430 is formed by half-etching, for example. The linkage portion 430 includes a linkage portion obverse surface 431, a linkage portion reverse surface 432, and a linkage portion end surface 433. The linkage portion obverse surface 431 and the linkage portion reverse surface 432 face mutually opposite sides in the z direction. The linkage portion obverse surface 431 faces upward in FIGS. 3 and 5. The linkage portion obverse surface 431 is flush with the wire bonding portion obverse surface 411. Accordingly, the wire bonding portion obverse surface 411, the terminal portion obverse surface 421, and the linkage portion obverse surface 431 are flush with each other forming a single surface (see FIG. 2). The linkage portion reverse surface 432 faces downward in FIGS. 3 and 5. Out of surfaces that connect the linkage portion obverse surface 431 to the linkage portion reverse surface 432, the linkage portion end surface 433 is a surface that faces the x direction and is exposed from the sealing resin 8.

The fifth lead 5 is disposed at an end portion on the one side (lower side in FIG. 2) of the semiconductor device A1 in the y direction as viewed in the z direction. The fifth lead 5 is disposed between the third lead 3 and the fourth lead 4, is adjacent to the fourth lead 4, and includes a wire bonding portion 510 and a terminal portion 520.

The wire bonding portion 510 has a rectangular shape that is elongated in the x direction as viewed in the z direction. The wire bonding portion 510 includes a wire bonding portion obverse surface 511, a wire bonding portion reverse surface 512, and a wire bonding portion reverse surface recess 513. The wire bonding portion obverse surface 511 and the wire bonding portion reverse surface 512 face mutually opposite sides in the z direction. The wire bonding portion obverse surface 511 faces upward in FIGS. 3 and 5. A bonding wire 9 is bonded to the wire bonding portion obverse surface 511. The wire bonding portion reverse surface 512 faces downward in FIGS. 3 and 5. The wire bonding portion reverse surface 512 is exposed from the sealing resin 8 and serves as a reverse surface terminal. The wire bonding portion reverse surface recess 513 is a portion of the wire bonding portion 510 that is recessed from the wire bonding portion reverse surface 512 in the z direction. The thickness (length in the z direction) of the portion of the wire bonding portion 510 in which the wire bonding portion reverse surface recess 513 is located is about half the thickness of a portion of the wire bonding portion 510 in which the wire bonding portion reverse surface 512 is located. The wire bonding portion reverse surface recess 513 is formed through half-etching, for example.

The terminal portion 520 is continuous to the wire bonding portion 510 and has a rectangular shape as viewed in the z direction. The terminal portion 520 is disposed at one end surface (end surface that faces the outside of the semiconductor device A1) of the wire bonding portion 510 in the y direction. The terminal portion 520 includes a terminal portion obverse surface 521, a terminal portion reverse surface 522, and a terminal portion end surface 523. The terminal portion obverse surface 521 and the terminal portion reverse surface 522 face mutually opposite sides in the z direction. The terminal portion obverse surface 521 faces upward in FIGS. 3 and 5. The terminal portion obverse surface 521 is flush with the wire bonding portion obverse surface 511. The terminal portion reverse surface 522 faces downward in FIGS. 3 and 5. The terminal portion reverse surface 522 is flush with the wire bonding portion reverse surface 512. The terminal portion end surface 523 connects the terminal portion obverse surface 521 to the terminal portion reverse surface 522 and faces outward in the y direction. The wire bonding portion reverse surface 512, the terminal portion reverse surface 522, and the terminal portion end surface 523 are exposed from the sealing resin 8, are continuous to each other, and serve as a terminal.

The sixth lead 6 is disposed between the third lead 3 and the fifth lead 5 at an end portion on the one side (lower side in FIG. 2) of the semiconductor device A1 in the y direction as viewed in the z direction. That is, the sixth lead 6 is adjacent to the third lead 3. The sixth lead 6 includes a wire bonding portion 610 and a terminal portion 620.

The wire bonding portion 610 has a rectangular shape that is elongated in the x direction as viewed in the z direction.

The wire bonding portion 610 includes a wire bonding portion obverse surface 611, a wire bonding portion reverse surface 612, and a wire bonding portion reverse surface recess 613. The wire bonding portion obverse surface 611 and the wire bonding portion reverse surface 612 face mutually opposite sides in the z direction. The wire bonding portion obverse surface 611 faces upward in FIGS. 3 and 5. A bonding wire 9 is bonded to the wire bonding portion obverse surface 611. The wire bonding portion reverse surface 612 faces downward in FIGS. 3 and 5. The wire bonding portion reverse surface 612 is exposed from the sealing resin 8 and serves as a reverse surface terminal. The wire bonding portion reverse surface recess 613 is a portion of the wire bonding portion 610 that is recessed from the wire bonding portion reverse surface 612 in the z direction. The thickness (length in the z direction) of the portion of the wire bonding portion 610 in which the wire bonding portion reverse surface recess 613 is located is about half the thickness of a portion of the wire bonding portion 610 in which the wire bonding portion reverse surface 612 is located. The wire bonding portion reverse surface recess 613 is formed through half-etching, for example.

The terminal portion 620 is continuous to the wire bonding portion 610 and has a rectangular shape as viewed in the z direction. The terminal portion 620 is disposed at one end surface (end surface that faces the outside of the semiconductor device A1) of the wire bonding portion 610 in the y direction. The terminal portion 620 includes a terminal portion obverse surface 621, a terminal portion reverse surface 622, and a terminal portion end surface 623. The terminal portion obverse surface 621 and the terminal portion reverse surface 622 face mutually opposite sides in the z direction. The terminal portion obverse surface 621 faces upward in FIGS. 3 and 5. The terminal portion obverse surface 621 is flush with the wire bonding portion obverse surface 611. The terminal portion reverse surface 622 faces downward in FIGS. 3 and 5. The terminal portion reverse surface 622 is flush with the wire bonding portion reverse surface 612. The terminal portion end surface 623 connects the terminal portion obverse surface 621 to the terminal portion reverse surface 622 and faces outward in the y direction. The wire bonding portion reverse surface 612, the terminal portion reverse surface 622, and the terminal portion end surface 623 are exposed from the sealing resin 8, are continuous to each other, and serve as a terminal.

The semiconductor element 7 exhibits electrical functions of the semiconductor device A1. The semiconductor element 7 includes a first transistor 791 and a second transistor 792. The first transistor 791 is a main transistor that performs switching operations to switch between a state in which a main current flows from the drain to the source and a state in which the main current does not flow, according to a voltage signal that is applied between the gate and the source. The second transistor 792 is a clamping transistor for suppressing fluctuation of the voltage between the gate and the source when the first transistor 791 is switched OFF. Also, the first transistor 791 and the second transistor 792 are transistors that perform normally-off operations and configured such that, if the source and the gate have the same potential, a channel enters an OFF state and a current does not flow between the source and the drain.

Figure 6:
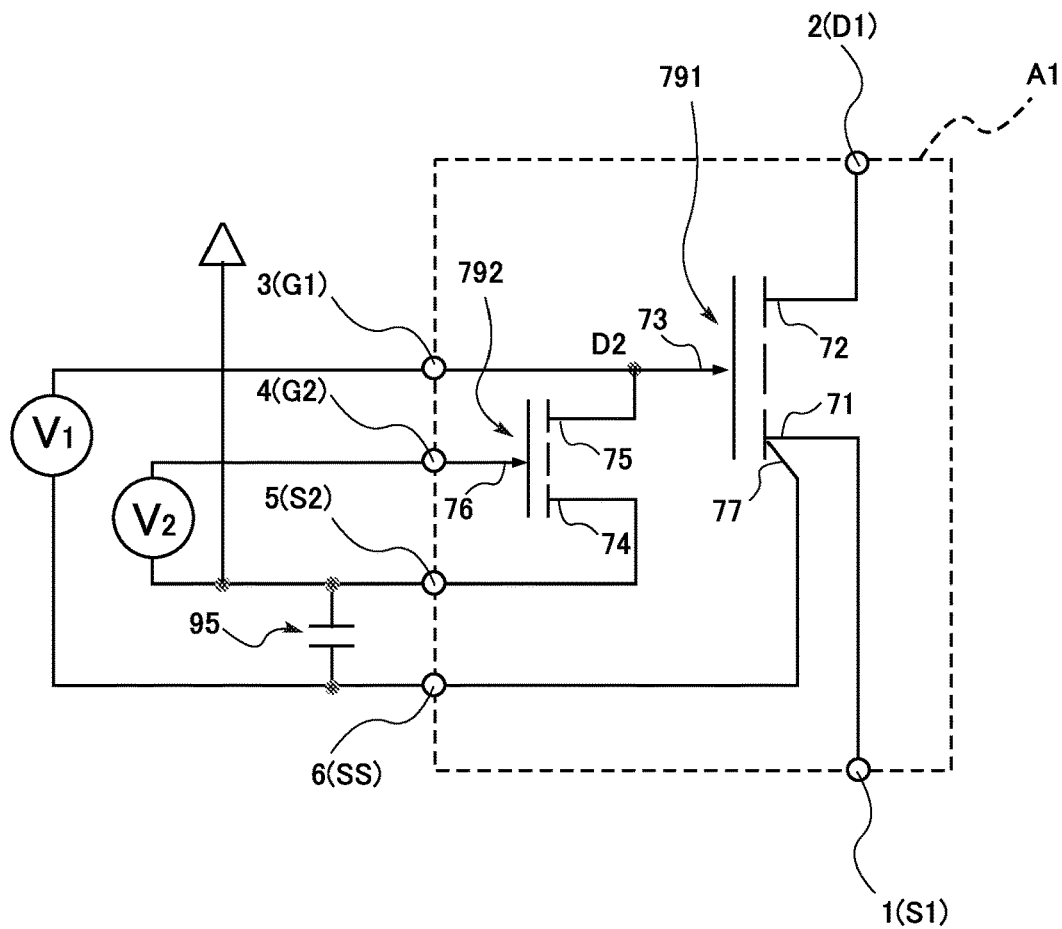
FIG. 6 is a circuit diagram of the semiconductor device shown in FIG. 1.

As shown in FIG. 6, the first transistor 791 includes a first source electrode 71, a first drain electrode 72, a first gate electrode 73, and a third source electrode 77. The third source electrode 77 is an electrode for so-called source sensing (or a driver source), is provided for detecting the potential of the source of the first transistor 791, and is electrically connected to the first source electrode 71. A main current of the first transistor 791 flows from the first source electrode 71 to the first lead 1 to which the first source electrode 71 is connected. A large current does not flow through the sixth lead 6 to which the third source electrode 77 is connected, and the sixth lead 6 outputs the potential of the source. The second transistor 792 includes a second source electrode 74, a second drain electrode 75, and a second gate electrode 76. The first gate electrode 73 of the first transistor 791 is electrically connected to the second drain electrode 75 of the second transistor 792. Also, the first source electrode 71 and the third source electrode 77 are not electrically connected to the second source electrode 74.

The semiconductor element 7 is obtained using a nitride semiconductor, and use is made of gallium nitride (GaN) in the present embodiment. In the present embodiment, the semiconductor element 7 is obtained through monolithic integration of the first transistor 791 and the second transistor 792, which are two HEMTs obtained using gallium nitride.

Figure 7:
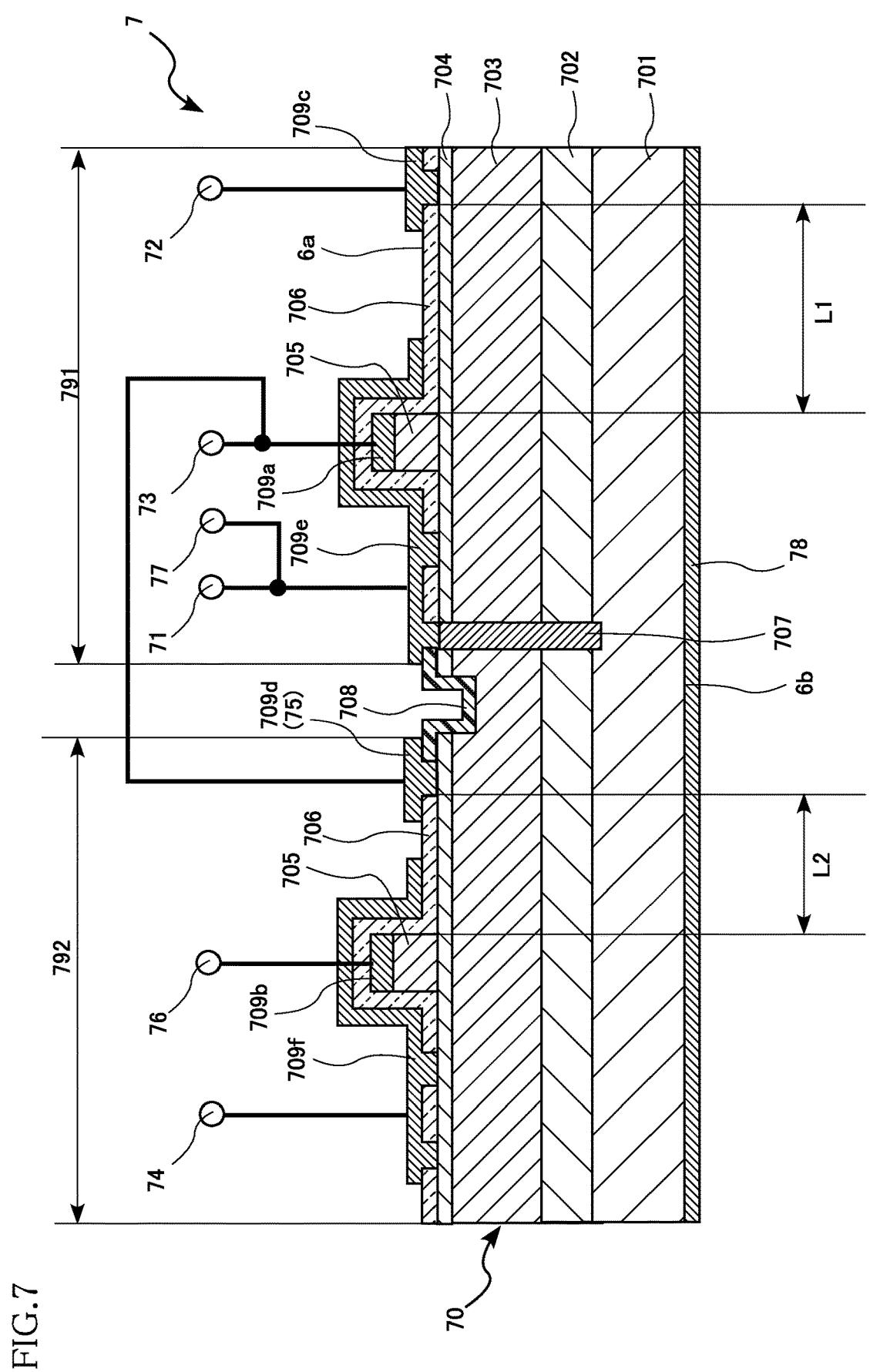
FIG. 7 is a schematic cross-sectional view showing a semiconductor element.

The semiconductor element 7 includes an element main body 70 and a reverse surface electrode 78. The element main body 70 includes an element obverse surface 7a and an element reverse surface 7b. As shown in FIGS. 3, 5, and 7, the element obverse surface 7a and the element reverse surface 7b face mutually opposite sides in the z direction. The element obverse surface 7a faces upward in FIGS. 3, 5, and 7. The element reverse surface 7b faces downward in FIGS. 3, 5, and 7. As shown in FIG. 7, the element main body 70 includes a substrate 701, a buffer layer 702, a first nitride semiconductor layer 703, a second nitride semiconductor layer 704, a third nitride semiconductor layer 705, a protective film 706, wirings 709, a conductive portion 707, and an insulation portion 708. The wirings 709 include wirings 709a, 709b, 709c, 709d, 709e, and 709f.

The substrate 701 may be an Si substrate having low resistance. The thickness (length in the z direction) of the substrate 701 is about 250 to 400 μm, for example. The buffer layer 702 is constituted by a plurality of buffer layers that are nitride semiconductor films formed on the substrate 701. In the present embodiment, the buffer layer 702 is constituted by a first buffer layer that is an AlN film and in contact with the substrate 701 and a second buffer layer that is an AlGaN film layered on the first buffer layer. The second buffer layer may also be a super lattice structure that is constituted by alternately layered AlN films and GaN films. The first nitride semiconductor layer 703 is constituted by a GaN layer that is layered on the buffer layer 702 through epitaxial growth and constitutes an electron transit layer. The second nitride semiconductor layer 704 is constituted by an AlGaN layer that is layered on the first nitride semiconductor layer 703 through epitaxial growth and constitutes an electron supply layer. The total thickness (length in the z direction) of the buffer layer 702, the first nitride semiconductor layer 703, and the second nitride semiconductor layer 704 is about 2 μm and is smaller than the thickness of the substrate 701. Two-dimensional electron gas (2DEG) that is generated at a position close to an interface between the first nitride semiconductor layer 703 and the second nitride semiconductor layer 704 is used as a conduction path. As shown in FIG. 7, the insulation portion 708 separates a region in which the first transistor 791 is formed and a region in which the second transistor 792 is formed, and reaches an intermediate portion of the first nitride semiconductor layer 703 in the z direction, and interrupts the conduction path formed by the two-dimensional electron gas.

The third nitride semiconductor layer 705 is constituted by a p-type GaN layer that is layered on the second nitride semiconductor layer 704 through epitaxial growth. The wiring 709a and the wiring 709b are respectively formed on segments of the third nitride semiconductor layer 705 that are spaced apart from each other. The protective film 706 is constituted by an SiN film, for example, and covers the second nitride semiconductor layer 704, the third nitride semiconductor layer 705, the wiring 709a, and the wiring 709b. A portion of the wiring 709a that is formed on one segment of the third nitride semiconductor layer 705 is exposed from the protective film 706 and is connected to the first gate electrode 73. The first gate electrode 73 functions as a gate electrode of the first transistor 791. Also, a portion of the wiring 709b that is formed on the other segment of the third nitride semiconductor layer 705 is exposed from the protective film 706 and is connected to the second gate electrode 76. The second gate electrode 76 functions as a gate electrode of the second transistor 792. The wirings 709c, 709d, 709e, and 709f are formed on the protective film 706. The wirings 709c, 709d, 709e, and 709f are spaced apart from each other, and respective portions of these wirings pass through the protective film 706 and are in contact with the second nitride semiconductor layer 704. The wiring 709e is formed so as to cover the third nitride semiconductor layer 705 and the wiring 709a and is connected to the first source electrode 71 and the third source electrode 77. The first source electrode 71 functions as a source electrode of the first transistor 791, and the third source electrode 77 functions as a source sense electrode of the first transistor 791. The wiring 709f is formed so as to cover the third nitride semiconductor layer 705 and the wiring 709b and is connected to the second source electrode 74. The second source electrode 74 functions as a source electrode of the second transistor 792. The wiring 709c is adjacent to the wiring 709e and is connected to the first drain electrode 72. The first drain electrode 72 functions as a drain electrode of the first transistor 791. The wiring 709d is adjacent to the wiring 709f and functions as the second drain electrode 75 that is a drain electrode of the second transistor 792. The wiring 709d (second drain electrode 75) is connected to the first gate electrode 73.

As shown in FIG. 7, in the second nitride semiconductor layer 704, a distance L1 between a region that is in contact with the wiring 709c and a region that is in contact with the third nitride semiconductor layer 705 on which the wiring 709a is formed is longer than a distance L2 between a region that is in contact with the wiring 709d and a region that is in contact with the third nitride semiconductor layer 705 on which the wiring 709b is formed. Therefore, a withstand voltage between the drain and the source of the second transistor 792 (i.e., a withstand voltage between the second drain electrode 75 and the second source electrode 74) is lower than a withstand voltage between the drain and the source of the first transistor 791 (i.e., a withstand voltage between the first drain electrode 72 and the first source electrode 71). The distance L2 can be made shorter than the distance L1 because the withstand voltage between the drain and the source of the second transistor 792 can be made lower than the withstand voltage between the drain and the source of the first transistor 791. Therefore, the region of the element obverse surface 7a of the semiconductor element 7 in which the second transistor 792 is located is smaller than the region of the element obverse surface 7a in which the first transistor 791 is located.

As shown in FIG. 2, the first source electrode 71, the first drain electrode 72, the first gate electrode 73, the second source electrode 74, the second gate electrode 76, and the third source electrode 77 are disposed on the element obverse surface 7a. In the present embodiment, the first source electrode 71 is disposed at the center of the element obverse surface 7a in the y direction and extends throughout the x direction. The first drain electrode 72 and the first gate electrode 73 are disposed opposite to each other in the y direction with the first source electrode 71 disposed therebetween, and are spaced apart from the first source electrode 71. The first drain electrode 72 is disposed on the second lead 2 side (upper side in FIG. 2) with respect to the first source electrode 71 and extends throughout the x direction. The first gate electrode 73 is disposed at an end portion that is located on the third lead 3 side (lower side in FIG. 2) with respect to the first source electrode 71 and on one side (right side in FIG. 2) in the x direction. The second gate electrode 76, the second source electrode 74, and the third source electrode 77 are disposed on the same side (lower side in FIG. 2) as the first gate electrode 73 in the y direction with respect to the first source electrode 71, and are spaced apart from the first source electrode 71. That is, as viewed in the z direction, the first drain electrode 72 is disposed opposite to the first gate electrode 73, the second gate electrode 76, the second source electrode 74, and the third source electrode 77 with the first source electrode 71 disposed therebetween. Also, the first gate electrode 73, the third source electrode 77, the second source electrode 74, and the second gate electrode 76 are disposed in this order in the x direction and are spaced apart from each other. That is, the first gate electrode 73 and the third source electrode 77 are adjacent to each other, and the second source electrode 74 and the second gate electrode 76 are adjacent to each other. As described above, the arrangement of the first source electrode 71, the first drain electrode 72, the first gate electrode 73, the third source electrode 77, the second source electrode 74, and the second gate electrode as viewed in the z direction is similar to the arrangement of the first lead 1, the second lead 2, the third lead 3, the sixth lead 6, the fifth lead 5, and the fourth lead 4 as viewed in the z direction. Note that the layout of the first source electrode 71, the first drain electrode 72, the first gate electrode 73, the second source electrode 74, the second gate electrode 76, and the third source electrode 77 is not limited to this example.

The reverse surface electrode 78 is formed on a reverse surface (a surface that faces opposite to a surface on which the buffer layer 702 is formed) of the substrate 701, and is disposed on the element reverse surface 7b.

The conductive portion 707 is a via hole (or simply "via"), for example, and passes through the second nitride semiconductor layer 704, the first nitride semiconductor layer 703, and the buffer layer 702 to reach the substrate 701. The conductive portion 707 is electrically connected to the wiring 709e that passes through the protective film 706, and is also electrically connected to the reverse surface electrode 78 via the substrate 701. Accordingly, the first source electrode 71 and the reverse surface electrode 78 are electrically connected to each other and have the same potential. Note that a configuration is also possible in which the conductive portion 707 also passes through the substrate 701 and reaches the reverse surface electrode 78. Also, the configuration of the semiconductor element 7 is not limited to the above-described configuration.

As shown in FIG. 2, the semiconductor element 7 is mounted at the center of the mounting portion obverse surface 111 in the x and y directions. As shown in FIG. 5, the semiconductor element 7 is mounted on the mounting portion obverse surface 111 of the first lead 1 via a conductive joining material (not shown) with the element reverse surface 7b facing the mounting portion obverse surface 111. Thus, the reverse surface electrode 78 of the semiconductor element 7 is electrically connected to the first lead 1 via the conductive joining material. The first source electrode 71 is electrically connected to the reverse surface electrode 78 via the wiring 709e, the conductive portion 707, and the substrate 701, and therefore has the same potential as the reverse surface electrode 78. Accordingly, the first source electrode 71 has the same potential as the first lead 1. Also, as a result of the first source electrode 71 and the first lead 1 being connected to each other using bonding wires 9, the first source electrode 71 has the same potential as the first lead 1.

The bonding wires 9 electrically connect electrodes of the semiconductor element 7 to the leads 1 to 6. Note that the number of bonding wires 9 connected between the electrodes and the leads 1 to 6 is not limited, and is appropriately determined according to the magnitude of currents flowing between the electrodes and the leads.

The first source electrode 71 and the mounting portion obverse surface 111 of the first lead 1 are connected to each other using bonding wires 9. Thus, the first lead 1 is electrically connected to the first source electrode 71 of the semiconductor element 7 and functions as a source terminal (S1) of the first transistor 791. The first drain electrode 72 and the wire bonding portion obverse surface 211 of the second lead 2 are connected to each other using bonding wires 9. Thus, the second lead 2 is electrically connected to the first drain electrode 72 of the semiconductor element 7 and functions as a drain terminal (D1) of the first transistor 791. The first gate electrode 73 and the wire bonding portion obverse surface 311 of the third lead 3 are connected to each other using a bonding wire 9. Thus, the third lead 3 is electrically connected to the first gate electrode 73 of the semiconductor element 7 and functions as a gate terminal (G1) of the first transistor 791. The third source electrode 77 and the wire bonding portion obverse surface 611 of the sixth lead 6 are connected to each other using a bonding wire 9. Thus, the sixth lead 6 is electrically connected to the third source electrode 77 of the semiconductor element 7 and functions as a source sense terminal (SS) of the first transistor 791.

The second source electrode 74 and the wire bonding portion obverse surface 511 of the fifth lead 5 are connected to each other using a bonding wire 9. Thus, the fifth lead 5 is electrically connected to the second source electrode 74 of the semiconductor element 7 and functions as a source terminal (S2) of the second transistor 792. The second gate electrode 76 and the wire bonding portion obverse surface 411 of the fourth lead 4 are connected to each other using a bonding wire 9. Thus, the fourth lead 4 is electrically connected to the second gate electrode 76 of the semiconductor element 7 and functions as a gate terminal (G2) of the second transistor 792.

The sealing resin 8 covers portions of the leads 1 to 6, the semiconductor element 7, and the bonding wires 9. The sealing resin 8 is made of a black epoxy resin, for example.

The sealing resin 8 includes a resin obverse surface 81, a resin reverse surface 82, and resin side surfaces 83. The resin obverse surface 81 and the resin reverse surface 82 face mutually opposite sides in the z direction. The resin obverse surface 81 faces upward in FIGS. 3 and 5, and the resin reverse surface 82 faces downward in FIGS. 3 and 5. The resin side surfaces 83 connect the resin obverse surface 81 and the resin reverse surface 82 to each other, and face the x direction or the y direction.

In the present embodiment, the resin side surfaces of the sealing resin 8 are flush with the linkage portion end surfaces 123 of the first lead 1, the terminal portion end surfaces 223 and the linkage portion end surfaces 233 of the second lead 2, the terminal portion end surface 323 and the linkage portion end surface 333 of the third lead 3, the terminal portion end surface 423 and the linkage portion end surface 433 of the fourth lead 4, the terminal portion end surface 523 of the fifth lead 5, and the terminal portion end surface 623 of the sixth lead 6. Also, the resin reverse surface of the sealing resin 8 is flush with the mounting portion reverse surface 112 of the first lead 1, the wire bonding portion reverse surface 212 and the terminal portion reverse surfaces 222 of the second lead 2, the wire bonding portion reverse surface 312 and the terminal portion reverse surface 322 of the third lead 3, the wire bonding portion reverse surface 412 and the terminal portion reverse surface 422 of the fourth lead 4, the wire bonding portion reverse surface 512 and the terminal portion reverse surface 522 of the fifth lead 5, and the wire bonding portion reverse surface 612 and the terminal portion reverse surface 622 of the sixth lead 6.

As shown in FIG. 6, a voltage signal (driving signal) is applied between the sixth lead 6 (source sense terminal SS of the first transistor 791) and the third lead 3 (gate terminal G1 of the first transistor 791). Also, a voltage signal, which is to turn the second transistor 792 ON when the first transistor 791 is OFF, is applied between the fifth lead 5 (source terminal S2 of the second transistor 792) and the fourth lead 4 (gate terminal G2 of the second transistor 792). Such a voltage signal may be a signal whose polarity is inverted from that of the driving signal. A capacitor 95 having a capacitance of about 10 µF, for example, is connected between the sixth lead 6 and the fifth lead 5 so that the fifth lead 5 will have a negative potential (e.g., about −2 V).

Next, functions and effects of the semiconductor device A1 will be described.

According to the present embodiment, the second transistor 792 for clamping is connected between the gate and the source of the first transistor 791. Fluctuation of the voltage between the gate and the source of the first transistor 791 can be suppressed by turning the second transistor 792 ON while the first transistor 791 is OFF. Also, the third source electrode 77 and the second source electrode 74 are not electrically connected to each other, and thus the third source electrode 77 and the second source electrode 74 can have different potentials. Therefore, a reference for the voltage between the gate and the source of the first transistor 791 can be made negative by making the potential of the second source electrode 74 lower than the potential of the third source electrode 77. Hence, even if the voltage between the drain and the source of the first transistor 791 suddenly increases and the voltage between the gate and the source fluctuates, the voltage between the gate and the source can be kept from exceeding the gate threshold value. Accordingly, even if the gate threshold value is small, false turn-on due to a sudden increase in the voltage between the drain and the source can be suppressed.

According to the present embodiment, the first source electrode 71 is electrically connected to the first lead 1 using the bonding wires 9. The first lead 1 is larger than the other leads 2 to 6 as viewed in the z direction, and the mounting portion reverse surface 112 is exposed from the sealing resin 8 and serves as a reverse surface terminal when the semiconductor device A1 is mounted on a circuit board. With this configuration, parasitic inductance of the source terminal through which a main current flows can be reduced to suppress a surge voltage between the drain and the source of the first transistor 791. Also, the first lead 1 on which the semiconductor element 7 is mounted is joined to a circuit board, and serves as the reverse surface terminal and therefore can also function as a heat dissipation plate for dissipating heat emitted from the semiconductor element 7.

According to the present embodiment, the second lead 2 is disposed opposite to the third lead 3, the fourth lead 4, the fifth lead 5, and the sixth lead 6 in the y direction with the first lead 1 disposed therebetween. Further, the first drain electrode 72 is disposed on the second lead 2 side in the y direction with respect to the first source electrode 71. Therefore, the bonding wires 9 connected to the first drain electrode 72 and the second lead 2 can be short. Also, the first gate electrode 73, the second gate electrode 76, the second source electrode 74, and the third source electrode 77 are disposed opposite to the second lead 2 with respect to the first source electrode 71. Further, the third lead 3, the sixth lead 6, the fifth lead 5, and the fourth lead 4 are disposed in this order in the x direction, and the first gate electrode 73, the third source electrode 77, the second source electrode 74, and the second gate electrode 76 are disposed in this order in the x direction. Therefore, the bonding wire 9 connecting the first gate electrode 73 to the third lead 3, the bonding wire 9 connecting the third source electrode 77 to the sixth lead 6, the bonding wire 9 connecting the second source electrode 74 to the fifth lead 5, and the bonding wire 9 connecting the second gate electrode 76 to the fourth lead 4 can be made as short as possible. Thus, parasitic inductance of each bonding wire 9 can be reduced. Accordingly, a surge voltage between the drain and the source of the first transistor 791 and a surge voltage between the gate and the source of the first transistor 791 can be suppressed.

According to the present embodiment, the first gate electrode 73 and the third source electrode 77 are adjacent to each other, and the second source electrode 74 and the second gate electrode 76 are adjacent to each other. With this configuration, lengths of the wirings 709 inside the semiconductor element 7 need not be unduly increased, and parasitic inductance of the wirings 709 can be reduced. Accordingly, a surge voltage between the gate and the source of the first transistor 791 can be suppressed.

According to the present embodiment, the first gate electrode 73 and the second drain electrode 75 are electrically connected to each other via a wiring 709 inside the semiconductor element 7. With this configuration, parasitic inductance of a current path for clamping, which is realized using the second transistor 792, can be reduced when compared to a case in which the first gate electrode 73 and the second drain electrode 75 are connected to each other using a bonding wire 9 outside the semiconductor element 7. Therefore, a surge voltage between the gate and the source of the first transistor 791 can be suppressed.

According to the present embodiment, the withstand voltage between the drain and the source of the second transistor 792 is lower than the withstand voltage between the drain and the source of the first transistor 791, and accordingly the region of the element obverse surface 7*a* of the semiconductor element 7 in which the second transistor 792 is located is made smaller than the region of the element obverse surface 7*a* in which the first transistor 791 is located by setting the distance L2 shorter than the distance L1. With this configuration, lengths of the wirings 709 inside the semiconductor element 7 need not be unduly increased, and parasitic inductance of the wirings 709 can be reduced. Therefore, a surge voltage between the drain and the source of the first transistor 791 and a surge voltage between the gate and the source of the first transistor 791 can be suppressed.

According to the present embodiment, the first spacing distance D1 between the first lead 1 and the second lead 2 is longer than the second spacing distance D2 between the first lead 1 and the leads 3 to 6. With this configuration, dielectric strength between the first lead 1 and the second lead 2 to which a higher voltage is applied can be increased.

According to the present embodiment, the semiconductor device A1 includes the sixth lead 6 that is connected to the first source electrode 71 via the third source electrode 77, separately from the first lead 1. With this configuration, the semiconductor device A1 can include the source sense terminal (sixth lead 6) through which a main current, which is the target of switching, does not flow and that is used for detecting the potential of the source electrode (first source electrode 71), separately from the source terminal (first lead 1) through which the main current flows.

Note that the present embodiment describes a case in which the first transistor 791 and the second transistor 792 that constitute the semiconductor element are transistors that preferably perform normally-off operations, but the disclosure is not limited to this configuration. The first transistor 791 or the second transistor 792 may also be a transistor that performs normally-on operations.

Also, the present embodiment describes a case in which the resin side surfaces 83 of the sealing resin 8 are flush with the linkage portion end surfaces 123 of the first lead 1, the terminal portion end surfaces 223 and the linkage portion end surfaces 233 of the second lead 2, the terminal portion end surface 323 and the linkage portion end surface 333 of the third lead 3, the terminal portion end surface 423 and the linkage portion end surface 433 of the fourth lead 4, the terminal portion end surface 523 of the fifth lead 5, and the terminal portion end surface 623 of the sixth lead 6, but there is no limitation to this configuration. A configuration is also possible in which these end surfaces protrude from the resin side surfaces 83 or are recessed from the resin side surfaces 83. Also, these end surfaces may be flat, curved, or uneven. Shapes of these end surfaces are also not limited.

Figure 8:
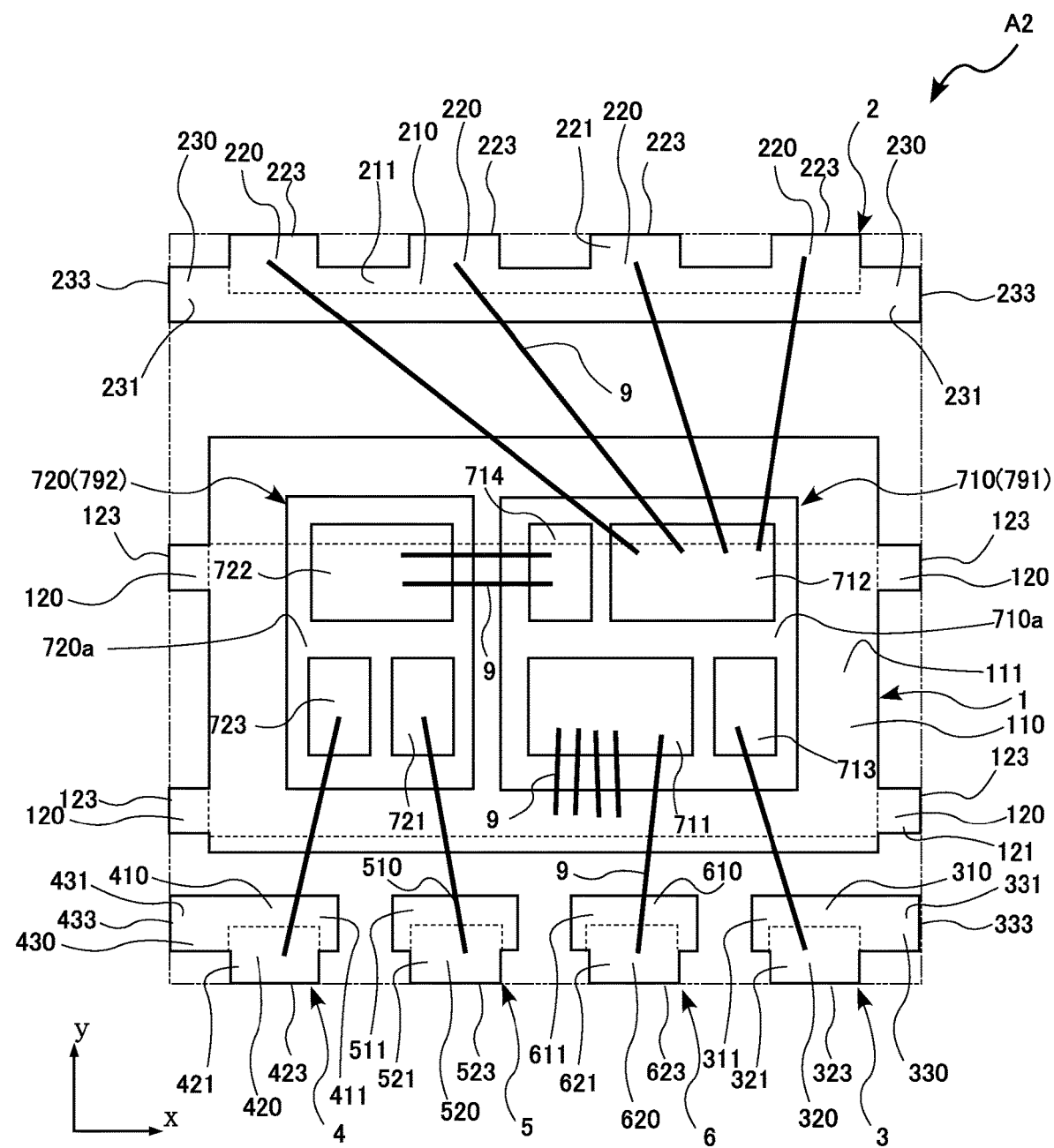
FIG. 8 is a plan view showing a semiconductor device according to a second embodiment of the present disclosure.

A semiconductor device A2 according to a second embodiment of the present disclosure will be described based on FIG. 8. In FIG. 8, elements that are the same as or are similar to those in the above-described semiconductor device A1 are denoted with the same reference numerals as those used for corresponding elements in the semiconductor device A1, and a redundant description thereof is omitted.

FIG. 8 is a plan view showing the semiconductor device A2. In FIG. 8, the sealing resin 8 is transparent and the external shape of the sealing resin 8 is indicated by an imaginary line (line-double-dash line) in order to facilitate understanding.

The semiconductor device A2 according to the present embodiment differs from the semiconductor device A1 in that the first transistor 791 and the second transistor 792 are formed as different semiconductor elements.

The semiconductor device A2 includes a first semiconductor element 710 and a second semiconductor element 720 instead of the semiconductor element 7. The first semiconductor element 710 constitutes the first transistor 791 and the second semiconductor element 720 constitutes the second transistor 792. The first semiconductor element 710 and the second semiconductor element 720 are disposed side by side in the x direction on the mounting portion obverse surface 111 of the first lead 1. In the x direction, the first semiconductor element 710 is disposed on a side (right side in FIG. 8) that is close to the third lead 3, and the second semiconductor element 720 is disposed on a side (left side in FIG. 8) that is close to the fourth lead 4.

The first semiconductor element 710 is a semiconductor element that is obtained using a nitride semiconductor, and is an HEMT obtained using gallium nitride (GaN) in the present embodiment. The first semiconductor element 710 includes an element obverse surface 710*a*, a first source electrode 711, a first drain electrode 712, a first gate electrode 713, and a third gate electrode 714. The element obverse surface 710*a* is similar to the element obverse surface 7*a* of the semiconductor element 7 and faces a side opposite to the first lead 1, and the first source electrode 711, the first drain electrode 712, the first gate electrode 713, and the third gate electrode 714 are disposed on the element obverse surface 710*a*.

In the present embodiment, the first source electrode 711 corresponds to the first source electrode 71 and the third source electrode 77 of the semiconductor element 7, is disposed on the lower left side in FIG. 8, and is electrically connected to the first lead 1 and the sixth lead 6 using bonding wires 9. The first drain electrode 712 corresponds to the first drain electrode 72 of the semiconductor element 7, is disposed on the upper right side in FIG. 8, and is electrically connected to the second lead 2 using bonding wires 9. The first gate electrode 713 corresponds to the first gate electrode 73 of the semiconductor element 7, is disposed on the lower right side in FIG. 8, and is electrically connected to the third lead 3 using a bonding wire 9. The third gate electrode 714 is electrically connected to the first gate electrode 713 inside the first semiconductor element 710, is disposed on the upper left side in FIG. 8, and is electrically connected to a second drain electrode 722 (described later) of the second semiconductor element 720 using bonding wires 9. Note that the layout of the first source electrode 711, the first drain electrode 712, the first gate electrode 713, and the third gate electrode 714 is not limited to this example.

The second semiconductor element 720 is a semiconductor element that is obtained using a nitride semiconductor, and is an HEMT obtained using gallium nitride (GaN) in the present embodiment. The second semiconductor element 720 includes an element obverse surface 720*a*, a second source electrode 721, the second drain electrode 722, and a second gate electrode 723. The element obverse surface 720*a* is similar to the element obverse surface 7*a* of the semiconductor element 7 and faces a side opposite to the first lead 1, and the second source electrode 721, the second drain electrode 722, and the second gate electrode 723 are disposed on the element obverse surface 720*a*.

In the present embodiment, the second source electrode 721 corresponds to the second source electrode of the semiconductor element 7, is disposed on the lower right side in FIG. 8, and is electrically connected to the fifth lead 5 using a bonding wire 9. The second gate electrode 723 corresponds to the second gate electrode 76 of the semiconductor element 7, is disposed on the lower left side in FIG. 8, and is electrically connected to the fourth lead 4 using a bonding wire 9. The second drain electrode 722 is an electrode to which a wiring that corresponds to the wiring 709*d* (second drain electrode 75) of the semiconductor element 7 is connected. The second drain electrode 722 is disposed on the upper side in FIG. 8 and is electrically connected to the third gate electrode 714 of the first semiconductor element 710 using bonding wires 9. Note that the layout of the second source electrode 721, the second drain electrode 722, and the second gate electrode 723 is not limited to this example.

In the present embodiment as well, the second transistor 792 (second semiconductor element 720) for clamping is connected between the gate and the source of the first transistor 791 (first semiconductor element 710). Fluctuation of the voltage between the gate and the source of the first transistor 791 can be suppressed by turning the second transistor 792 ON while the first transistor 791 is turned OFF. Also, the first source electrode 711 and the second source electrode 721 are not electrically connected to each other, and accordingly the first source electrode 711 and the second source electrode 721 can have different potentials. Therefore, a reference for the voltage between the gate and the source of the first transistor 791 can be made a negative voltage by making the potential of the second source electrode 721 lower than the potential of the first source electrode 711. As a result, even if the voltage between the drain and the source of the first transistor 791 suddenly increases and the voltage between the gate and the source fluctuates, the voltage between the gate and the source can be kept from exceeding a gate threshold value. Therefore, even if the gate threshold value is small, false turn-on due to a sudden increase in the voltage between the drain and the source can be further suppressed.

Furthermore, according to the present embodiment, the first drain electrode 712 is disposed on the second lead 2 side (upper side in FIG. 8) in the y direction. Therefore, the bonding wires 9 connected to the first drain electrode 712 and the second lead 2 can be made short. Furthermore, the first gate electrode 713 is disposed on the lower right side on the element obverse surface 710*a* of the first semiconductor element 710 disposed on the right side in FIG. 8, and the first source electrode 711 is disposed on the lower left side on the element obverse surface 710*a*. Also, the second source electrode 721 is disposed on the lower right side on the element obverse surface 720*a* of the second semiconductor element 720 disposed on the left side in FIG. 8, and the second gate electrode 723 is disposed on the lower left side on the element obverse surface 720*a*. Therefore, the bonding wire 9 connecting the first gate electrode 713 to the third lead 3, the bonding wire 9 connecting the first source electrode 711 to the sixth lead 6, the bonding wire 9 connecting the second source electrode 721 to the fifth lead 5, and the bonding wire 9 connecting the second gate electrode 723 to the fourth lead 4 can be made as short as possible. Thus, parasitic inductance of each bonding wire 9 can be reduced. Accordingly, a surge voltage between the drain and the source of the first transistor 791 and a surge voltage between the gate and the source of the first transistor 791 can be suppressed.

Also, according to the present embodiment, the third gate electrode 714 is disposed on the upper left side on the element obverse surface 710*a* of the first semiconductor element 710 in FIG. 8, and the second drain electrode 722 is disposed on the upper side on the element obverse surface 720*a* of the second semiconductor element 720 in FIG. 8. Therefore, the bonding wires 9 connecting the third gate electrode 714 to the second drain electrode 722 can be made as short as possible. Thus, parasitic inductance of the bonding wires 9 can be reduced. Accordingly, a surge voltage between the gate and the source of the first transistor 791 can be suppressed.

Figure 9:
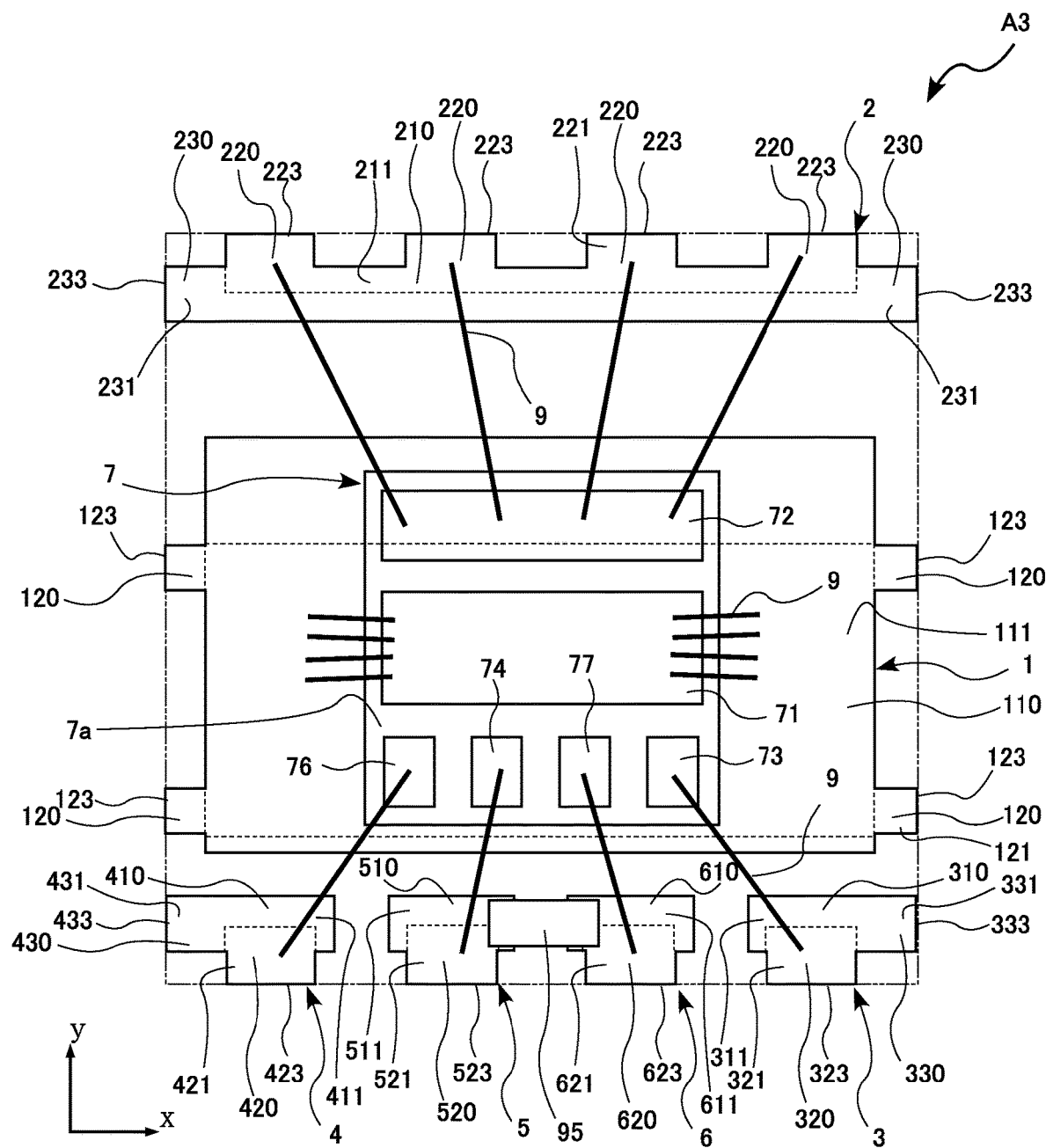
FIG. 9 is a plan view showing a semiconductor device according to a third embodiment of the present disclosure.

A semiconductor device A3 according to a third embodiment of the present disclosure will be described based on FIG. 9. In FIG. 9, elements that are the same as or are similar to those in the above-described semiconductor device A1 are denoted with the same reference numerals as those used for corresponding elements in the semiconductor device A1, and a redundant description thereof is omitted.

FIG. 9 is a plan view showing the semiconductor device A3. In FIG. 9, the sealing resin 8 is transparent and the external shape of the sealing resin 8 is indicated by an imaginary line (line-double-dash line) in order to facilitate understanding.

The semiconductor device A3 according to the present embodiment differs from the semiconductor device A1 in that the capacitor 95 is provided inside the semiconductor device A3. The capacitor 95 is provided for making the third source electrode 77 of the first transistor 791 and the second source electrode 74 of the second transistor 792 have different potentials, and has a capacitance of about 10 µF, for example. A terminal of the capacitor 95 is joined to the wire bonding portion obverse surface 511 of the fifth lead 5 and another terminal of the capacitor 95 is joined to the wire bonding portion obverse surface 611 of the sixth lead 6. The fifth lead 5 is connected to the second source electrode 74 using a bonding wire 9, and the sixth lead 6 is connected to the third source electrode 77 using a bonding wire 9. Therefore, the capacitor 95 is connected between the second source electrode 74 and the third source electrode 77.

Effects similar to those of the first embodiment can be achieved in the present embodiment as well. Furthermore, according to the present embodiment, the capacitor 95 is provided inside a package of the semiconductor device A3, and therefore the capacitor 95 need not be connected outside the package. Furthermore, parasitic inductance of a current path for causing a short circuit between the gate and the source of the first transistor 791 can be reduced when compared to a case in which the capacitor 95 is connected outside the package, and the value of the parasitic inductance can be prevented from fluctuating depending on the user. As a result, a surge voltage between the gate and the source of the first transistor 791 can be stably suppressed.

Note that the present embodiment describes a case in which a terminal of the capacitor 95 is joined to the fifth lead 5 and another terminal of the capacitor 95 is joined to the sixth lead 6, but there is no limitation to this configuration. A configuration is also possible in which a terminal of the capacitor 95 is joined to the second source electrode 74 and another terminal of the capacitor 95 is joined to the third source electrode 77. In this case, parasitic inductance of a current path for causing a short circuit between the gate and the source of the first transistor 791 can be further reduced. Accordingly, a surge voltage between the gate and the source of the first transistor 791 can be further suppressed. Furthermore, the third source electrode 77 and the first source electrode 71 are electrically connected to each other, and accordingly the other terminal of the capacitor 95 may also be joined to the first lead 1 that is connected to the first source electrode 71 by bonding wires 9. A configuration is also possible in which a terminal of the capacitor 95 is joined to the second source electrode 74 and another terminal of the capacitor 95 is joined to the first source electrode 71.

A semiconductor device A4 according to a fourth embodiment of the present disclosure will be described based on FIGS. 10 and 11. In these drawings, elements that are the same as or are similar to those in the above-described semiconductor device A1 are denoted with the same reference numerals as those used for corresponding elements in the semiconductor device A1, and a redundant description thereof is omitted.

Figure 10:
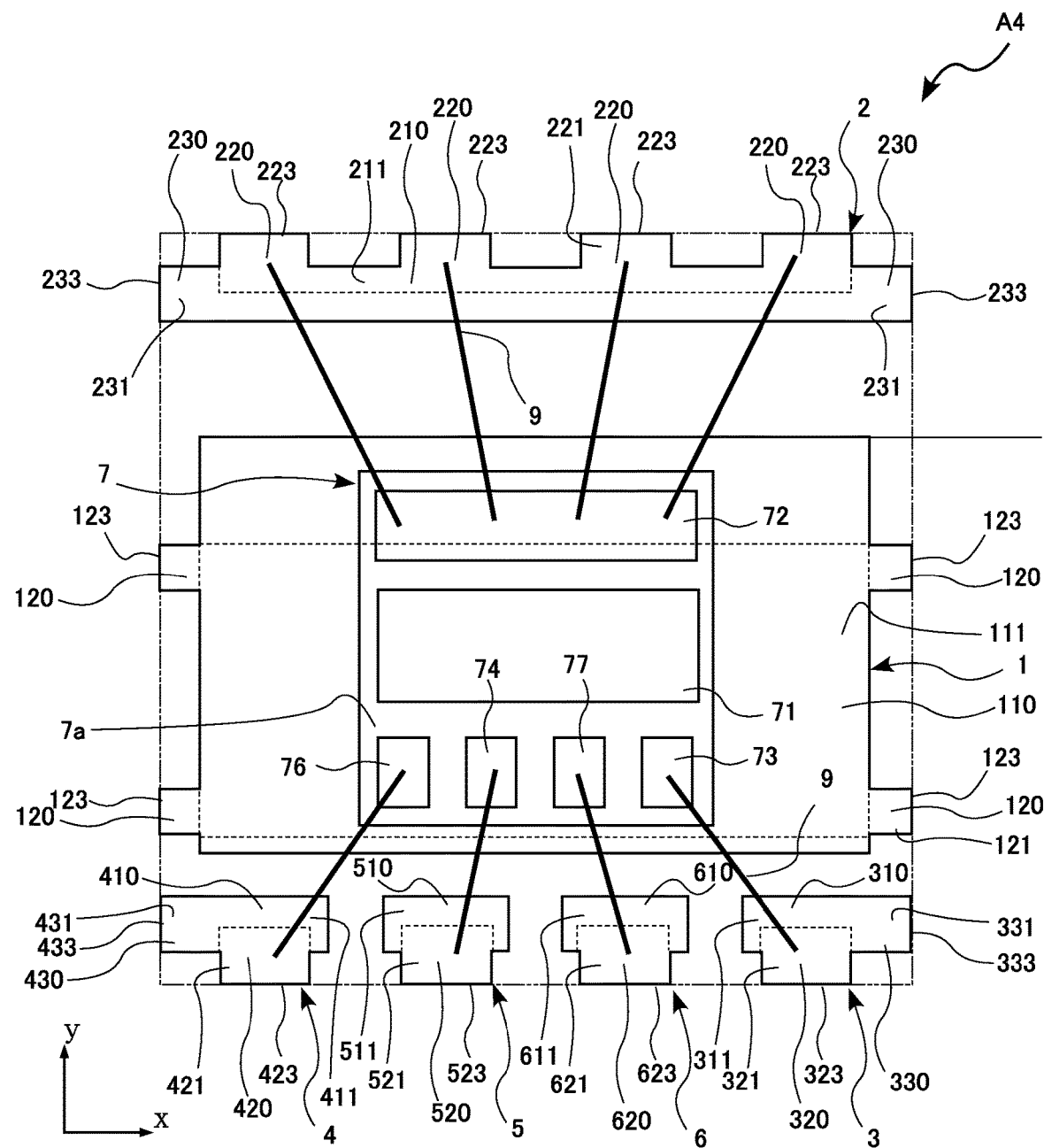
FIG. 10 is a plan view showing a semiconductor device according to a fourth embodiment of the present disclosure.

FIG. 10 is a plan view showing the semiconductor device A4. In FIG. 10, the sealing resin 8 is transparent and the external shape of the sealing resin 8 is indicated by an imaginary line (line-double-dash line) in order to facilitate understanding. FIG. 11 is a schematic cross-sectional view showing the semiconductor element 7 included in the semiconductor device A4.

Figure 11:
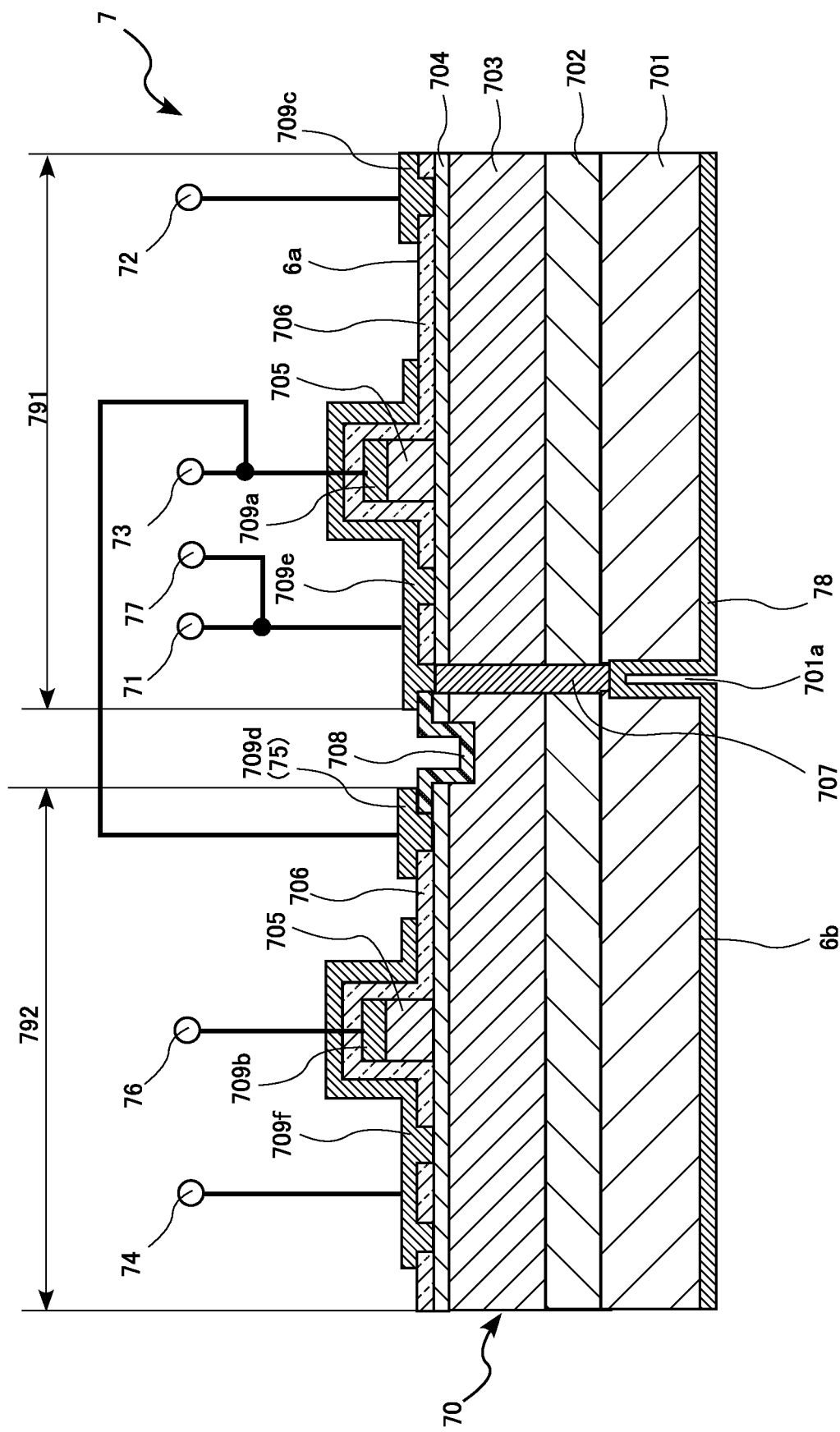
FIG. 11 is a schematic cross-sectional view of a semiconductor element included in the semiconductor device shown in FIG. 10.

The semiconductor device A4 according to the present embodiment differs from the semiconductor device A1 in that the first source electrode 71 and the first lead 1 are not connected to each other using bonding wires 9 as shown in FIG. 10 and the conductive portion 707 and the reverse surface electrode 78 are electrically connected to each other inside the semiconductor element as shown in FIG. 11. The substrate 701 of the semiconductor element 7 according to the present embodiment includes a hole 701a. The hole 701a is disposed at a position that overlaps the conductive portion 707 as viewed in the z direction, extends from the reverse surface of the substrate 701 toward the buffer layer 702 in the z direction, and reaches the conductive portion 707. The reverse surface electrode 78 is also formed inside the hole 701a and is electrically connected to the conductive portion 707. The reverse surface electrode 78 is electrically connected to the first lead 1 via the conductive joining material, and therefore, even if the first source electrode 71 and the first lead 1 are not connected to each other using bonding wires 9, a main current can flow from the first source electrode 71 to the first lead 1. In the present embodiment, the reverse surface electrode 78 corresponds to a "first source electrode" in the present disclosure.

Effects similar to those of the first embodiment can be achieved in the present embodiment as well. Furthermore, according to the present embodiment, a process for connecting the first source electrode 71 and the first lead 1 to each other using bonding wires 9 can be omitted, and the amount of bonding wires 9 used can be reduced. Also, parasitic inductance can be reduced when compared to a case in which the first source electrode 71 and the first lead 1 are connected to each other using bonding wires 9. Accordingly, a surge voltage between the drain and the source of the first transistor 791 can be suppressed.

Note that the present embodiment describes a case in which the first source electrode 71 is disposed on the element obverse surface 7a, but there is no limitation to this configuration. A configuration is also possible in which the first source electrode 71 is not disposed on the element obverse surface 7a.

A semiconductor device A5 according to a fifth embodiment of the present disclosure will be described based on FIGS. 12 and 13. In these drawings, elements that are the same as or are similar to those in the above-described semiconductor device A1 are denoted with the same reference numerals as those used for corresponding elements in the semiconductor device A1, and a redundant description thereof is omitted.

Figure 12:
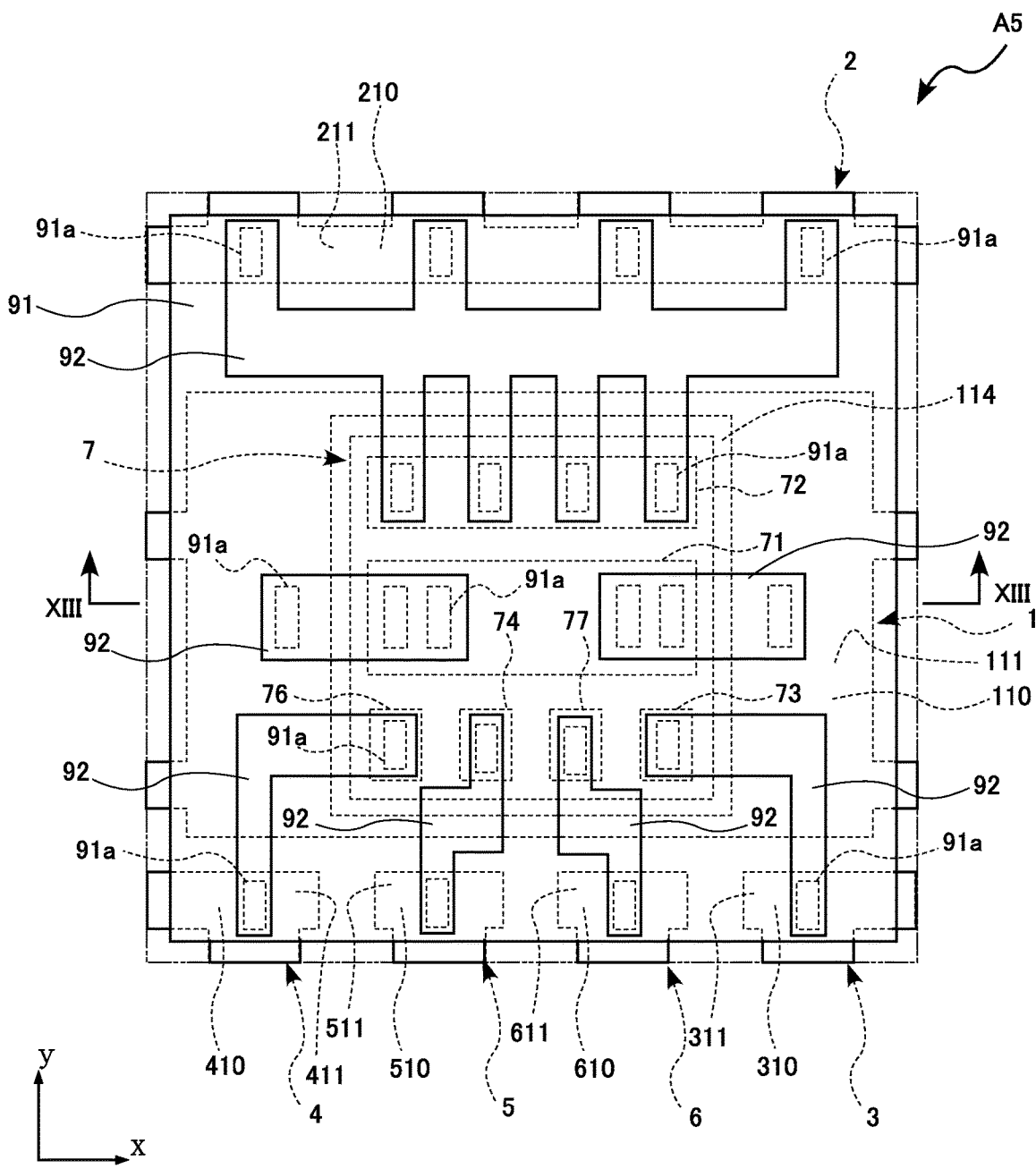
FIG. 12 is a plan view showing a semiconductor device according to a fifth embodiment of the present disclosure.
Figure 13:
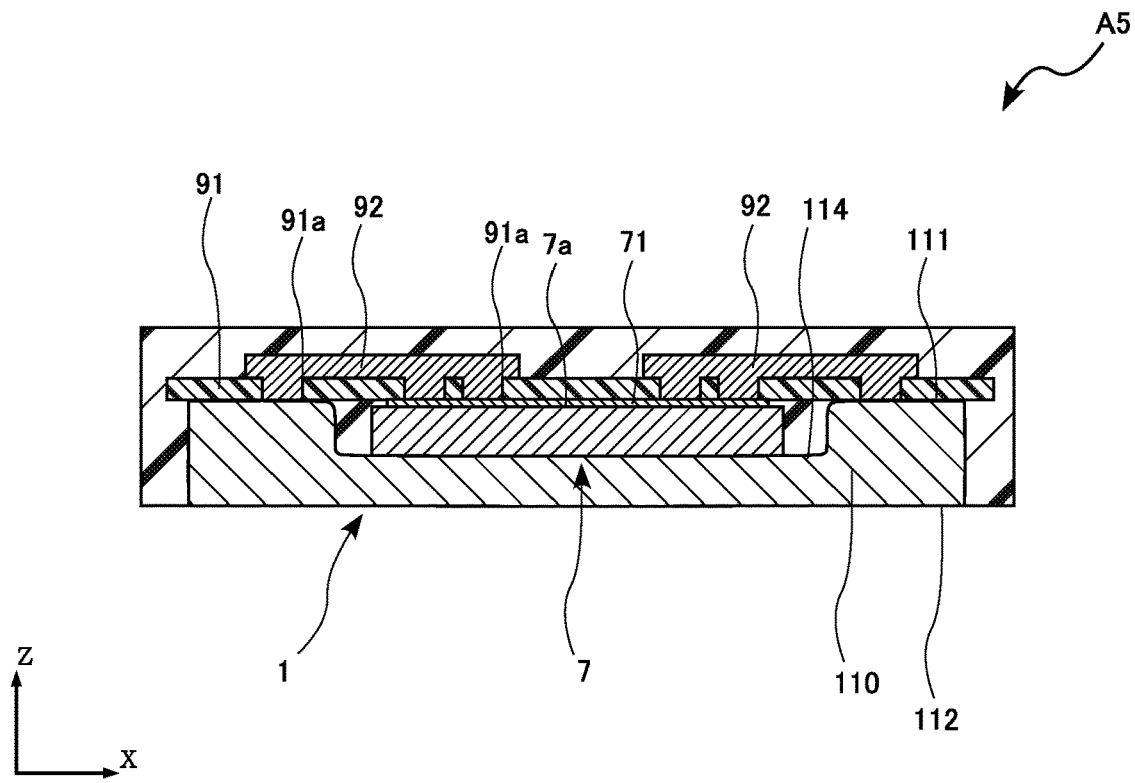
FIG. 13 is a cross-sectional view taken along line XIII-XIII in FIG. 12.

FIG. 12 is a plan view showing the semiconductor device A5. In FIG. 12, the sealing resin 8 is transparent and the external shape of the sealing resin 8 is indicated by an imaginary line (line-double-dash line) in order to facilitate understanding. FIG. 13 is a cross-sectional view taken along line XIII-XIII in FIG. 12.

The semiconductor device A5 according to the present embodiment differs from the semiconductor device A1 in the method for connecting electrodes of the semiconductor element 7 to the leads 1 to 6.

The semiconductor device A5 does not include bonding wires 9 and includes an insulation sheet 91 and a plating layer 92. The mounting portion 110 of the first lead 1 according to the present embodiment includes a mounting portion obverse surface recess 114. The mounting portion obverse surface recess 114 is a portion of the mounting portion 110 that is recessed from the mounting portion obverse surface 111 in the z direction. The thickness (length in the z direction) of the portion of the mounting portion 110 in which the mounting portion obverse surface recess 114 is located is about half the thickness of a portion of the mounting portion 110 in which the mounting portion obverse surface 111 is located. The mounting portion obverse surface recess 114 is formed through half-etching, for example. In the present embodiment, the semiconductor element 7 is disposed inside the mounting portion obverse surface recess 114. The thickness (length in the z direction) from the mounting portion reverse surface 112 of the first lead 1 to the element obverse surface 7a of the semiconductor element 7 disposed inside the mounting portion obverse surface recess 114 is substantially the same as the thickness (length in the z direction) from the mounting portion reverse surface 112 to the mounting portion obverse surface 111.

The insulation sheet 91 is made of a polyimide resin, for example, and is disposed in contact with obverse surfaces of the leads 1 to 6 and the element obverse surface 7a. The insulation sheet 91 includes a plurality of openings 91a. The openings 91a are each disposed at a position that overlaps any of the leads 1 to 6 and the electrodes 71 to 74 and 76 to 77, and extend through the insulation sheet 91. The openings 91a are formed using a laser, for example, after the insulation sheet 91 has been disposed on the obverse surfaces of the leads 1 to 6 and the element obverse surface 7a. The plating layer 92 is formed on the insulation sheet 91 and fills the openings 91a. The leads 1 to 6 are electrically connected to predetermined electrodes disposed on the element obverse surface 7a via the plating layer 92. That is, the electrodes of the semiconductor element 7 are electrically connected to the leads 1 to 6 via the plating layer 92 instead of bonding wires 9.

Effects similar to those of the first embodiment can be achieved in the present embodiment as well. Furthermore, according to the present embodiment, the electrodes need not be connected to the leads 1 to 6 using bonding wires 9. Also, parasitic inductance can be reduced when compared to a case in which the electrodes are connected to the leads 1 to 6 using bonding wires 9. Accordingly, a surge voltage between the drain and the source of the first transistor 791 and a surge voltage between the gate and the source of the first transistor 791 can be suppressed.

Figure 14:
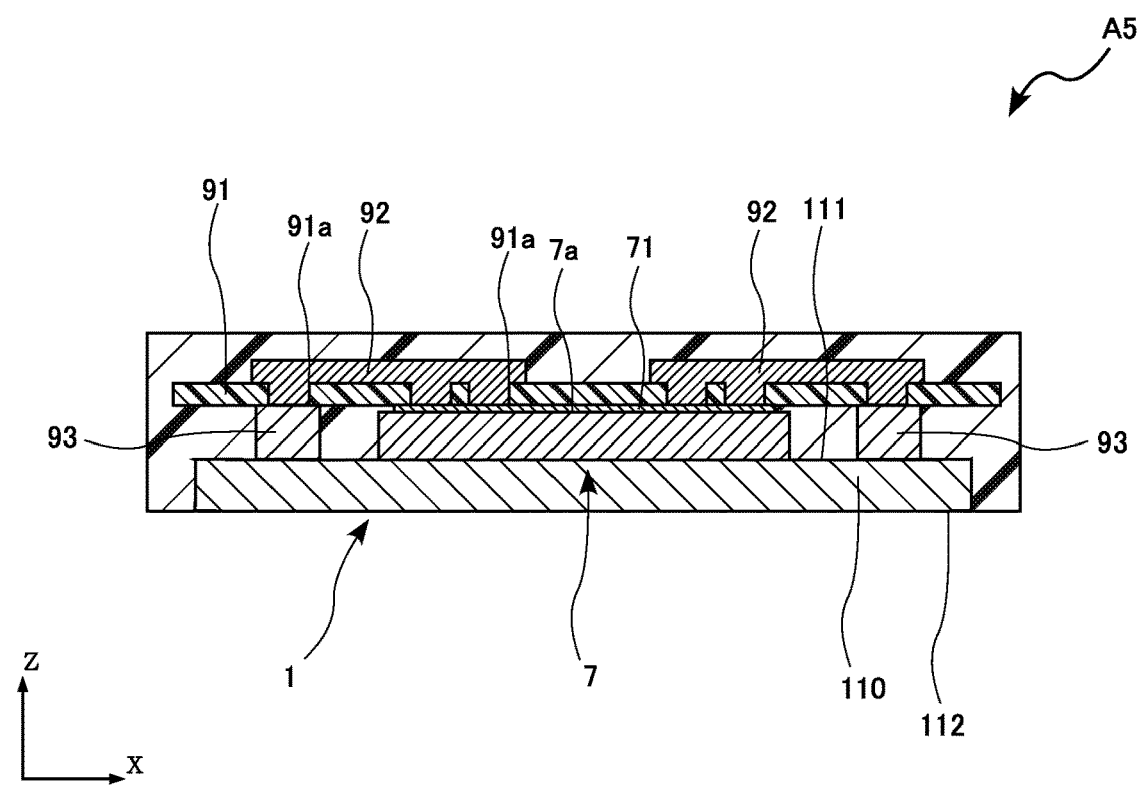
FIG. 14 is a cross-sectional view showing a variation of the semiconductor device according to the fifth embodiment of the present disclosure.

Note that, as shown in FIG. 14, a configuration is also possible in which the mounting portion 110 of the first lead 1 does not include the mounting portion obverse surface recess 114, the semiconductor element 7 is disposed on the mounting portion obverse surface 111, and metal spacers 93 that are made of Cu, for example, and electrically connected to the leads 1 to 6 and the plating layer 92 are disposed at positions of the leads 1 to 6 that overlap the openings 91a of the insulation sheet 91. Alternatively, a configuration is also possible in which the electrodes and the leads 1 to 6 are electrically connected to each other using a metal plate made of Cu, for example, or a lead frame, instead of bonding wires 9 and the plating layer 92.

A semiconductor device A6 according to a sixth embodiment of the present disclosure will be described based on FIGS. 15 and 16. In these drawings, elements that are the same as or are similar to those in the above-described semiconductor device A1 are denoted with the same reference numerals as those used for corresponding elements in the semiconductor device A1, and a redundant description thereof is omitted.

Figure 15:
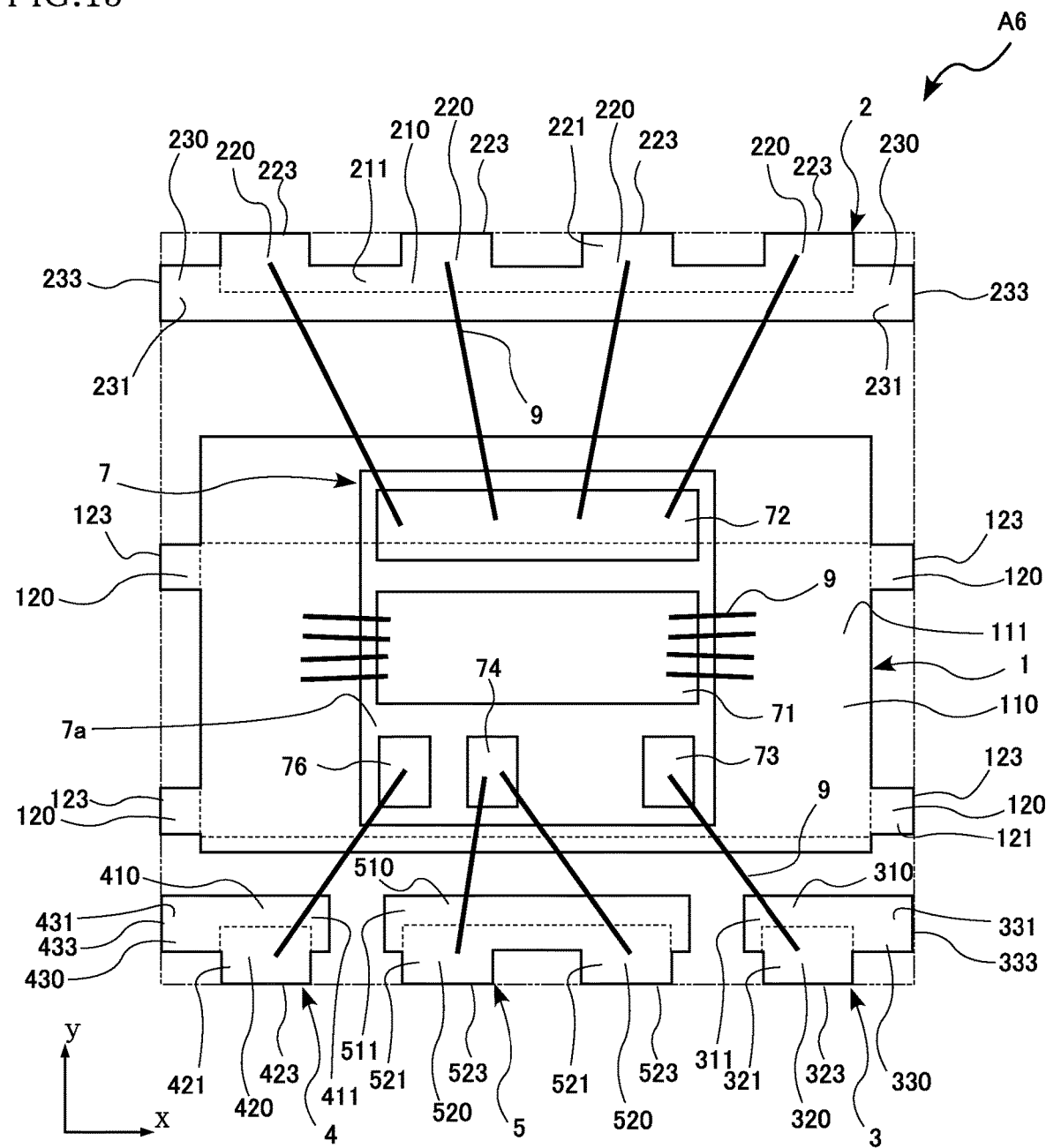
FIG. 15 is a plan view showing a semiconductor device according to a sixth embodiment of the present disclosure.
Figure 16:
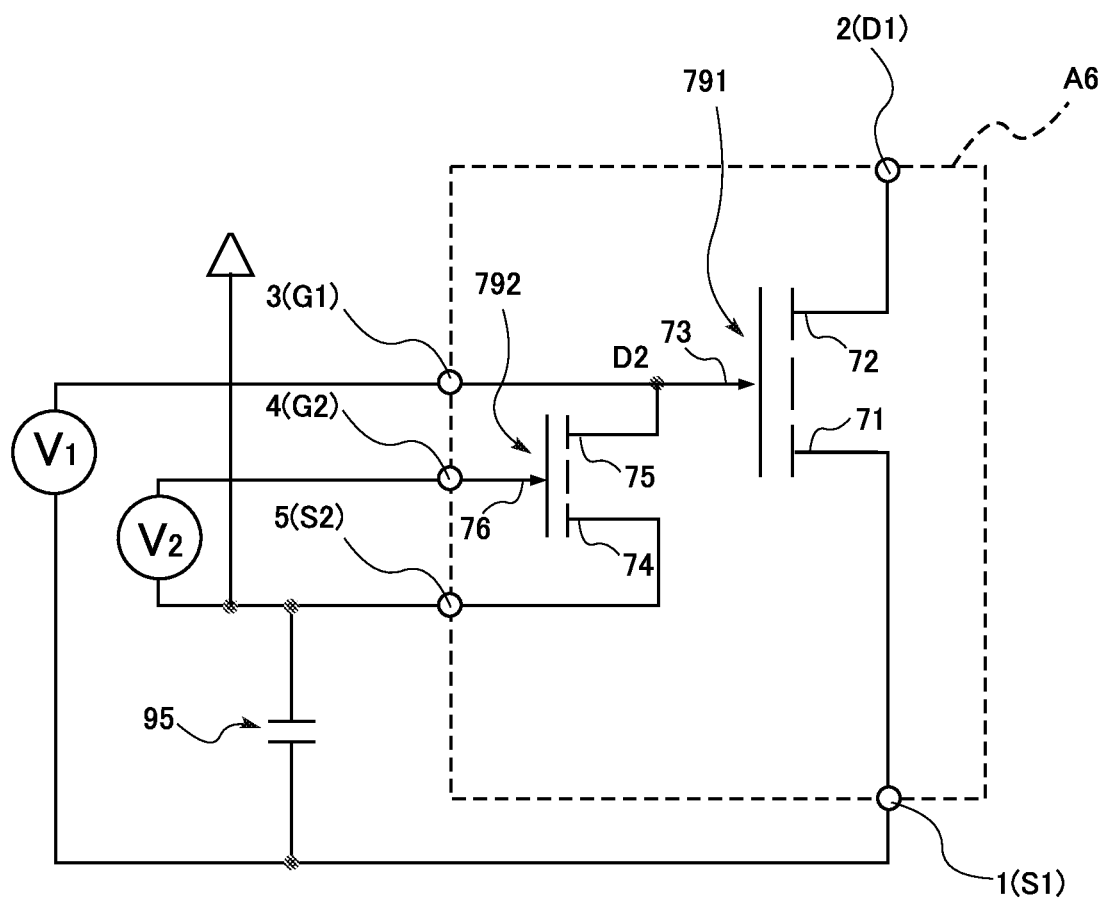
FIG. 16 is a circuit diagram of the semiconductor device shown in FIG. 15.

FIG. 15 is a plan view showing the semiconductor device A6. In FIG. 15, the sealing resin 8 is transparent and the external shape of the sealing resin 8 is indicated by an imaginary line (line-double-dash line) in order to facilitate understanding. FIG. 16 is a circuit diagram showing the semiconductor device A6.

The semiconductor device A6 according to the present embodiment differs from the semiconductor device A1 in that the semiconductor device A6 does not include the third source electrode 77 and the sixth lead 6. As shown in FIG. 15, the fifth lead 5 according to the present embodiment extends to the vicinity of the third lead 3 in the x direction and includes two terminal portions 520. Note that a configuration is also possible in which the fifth lead 5 is the same as that in the first embodiment and the sixth lead 6 is omitted from the semiconductor device A1 according to the first embodiment. As shown in FIG. 16, a voltage signal that is a driving signal is applied between the first lead 1 that is the source terminal (S1) of the first transistor 791 and the third lead 3 that is the gate terminal (G1) of the first transistor 791, and the other terminal of the capacitor 95 is connected to the first lead 1.

Effects similar to those of the first embodiment can be achieved in the present embodiment as well.

A semiconductor device according to the present disclosure is not limited to the above-described embodiments. Various design changes can be made to specific configurations of portions of a semiconductor device according to the present disclosure.

The invention claimed is:

1. A semiconductor device comprising:
    an electron transit layer made of a first nitride semiconductor;
    an electron supply layer formed on the electron transit layer and made of a second nitride semiconductor layer;
    a first HEMT transistor being formed on the electron supply layer and having a first source electrode and a first drain electrode controlled by a first gate electrode;
    a second HEMT transistor being formed on the electron supply layer and having a second source electrode and a second drain electrode controlled by a second gate electrode that is different from the first gate electrode;
    a p-type GaN layer being made of a third nitride semiconductor layer between each of the first and second gate electrodes and the electron supply layer, without touching the source electrodes or the drain electrodes; and
    a sealing resin covering the first HEMT transistor and the second HEMT transistor.

2. The semiconductor device according to claim 1, wherein a distance (L2) between the second drain electrode and the second source electrode is smaller than a distance (L1) between the first drain electrode and the first gate electrode.

3. The semiconductor device according to claim 1, further comprising a recessed portion which penetrates the electron supply layer and is extended to a halfway depth of the electron transit layer, between the first HEMT and the second HEMT.

4. The semiconductor device according to claim 1, further comprising a lead terminal which is connected to the first source electrode and works as a source sense terminal.

5. The semiconductor device according to claim 4, wherein a voltage signal as a driving signal is applied to the lead terminal.

6. The semiconductor device according to claim 1, wherein one of the source electrodes is connected to a substrate via a conductive portion.

7. The semiconductor device according to claim 6, wherein one of the first source electrode and the second source electrode is connected to the substrate via a wire.

8. The semiconductor device according to claim 1, wherein
the first HEMT transistor and the second HEMT transistor are monolithically integrated on a single semiconductor element, and
the first gate electrode and the second drain electrode are electrically connected to each other inside the semiconductor element.

9. The semiconductor device according to claim 1, wherein the first HEMT transistor is formed as a first semiconductor element, and the second HEMT transistor is formed as a second semiconductor element that is separate from the first semiconductor element.

10. The semiconductor device according to claim 1, wherein a withstand voltage between the second drain electrode and the second source electrode of the second HEMT transistor is lower than a withstand voltage between the first drain electrode and the first source electrode of the first HEMT transistor.

11. The semiconductor device according to claim 1, wherein the first HEMT transistor is a transistor that performs normally-off operations.

12. A semiconductor device comprising:
an electron transit layer made of a first nitride semiconductor formed on a substrate;
an electron supply layer made of a second nitride semiconductor layer formed on the electron transit layer;
a p-type GaN layer made of a third nitride semiconductor layer formed on the electron supply layer;
a gate electrode formed on the p-type GaN layer; and
a source electrode and a drain electrode opposed to each other so as to have the gate electrode between them, wherein
the source electrode is connected to the substrate via a conductive portion formed to penetrate the electron supply layer and the electron transit layer, and
the p-type GaN layer is between the gate electrode and the electron supply layer, without touching the source electrode or the drain electrode.

13. The semiconductor device according to claim 12, further comprising a reverse surface electrode.

14. The semiconductor device according to claim 12, wherein the conductive portion is extended to a halfway depth of the substrate.

15. The semiconductor device according to claim 12, further comprising a recessed portion which penetrates the electron supply layer and is extended to a halfway depth of the electron transit layer.

16. The semiconductor device according to claim 12, further comprising a lead terminal which is connected to a first source electrode and works as a source sense terminal.

17. The semiconductor device according to claim 16, wherein a voltage signal as a driving signal is applied to the lead terminal.

* * * * *